(12) United States Patent
Nishimura et al.

(10) Patent No.: US 11,631,693 B2
(45) Date of Patent: Apr. 18, 2023

(54) SEMICONDUCTOR MEMORY DEVICE

(71) Applicant: Kioxia Corporation, Minato-ku (JP)

(72) Inventors: Takahito Nishimura, Kuwana (JP);
Genki Kawaguchi, Yokkaichi (JP);
Yusuke Okumura, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 245 days.

(21) Appl. No.: 16/993,366

(22) Filed: Aug. 14, 2020

(65) Prior Publication Data

US 2021/0288064 A1 Sep. 16, 2021

(30) Foreign Application Priority Data

Mar. 16, 2020 (JP) .............................. JP2020-044893

(51) Int. Cl.
*H01L 27/11582* (2017.01)
*H01L 27/11565* (2017.01)
*H01L 27/1157* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ................................................ H01L 27/11582
See application file for complete search history.

(56) References Cited

U.S. PATENT DOCUMENTS

| 9,171,860 | B2 | 10/2015 | Chae et al. |
| 9,754,963 | B1 | 9/2017 | Kawamura et al. |
| 9,806,093 | B2 | 10/2017 | Toyama et al. |
| 2019/0371813 | A1* | 12/2019 | Oike .................... H01L 23/528 |
| 2020/0027800 | A1 | 1/2020 | Yamamoto et al. |
| 2020/0388626 | A1* | 12/2020 | Baraskar ............. H01L 21/8239 |

FOREIGN PATENT DOCUMENTS

JP 2020-17572 A 1/2020

* cited by examiner

*Primary Examiner* — Christopher A Johnson
(74) *Attorney, Agent, or Firm* — Oblon, McClelland, Maier & Neustadt, L.L.P.

(57) ABSTRACT

According to one embodiment, a semiconductor memory device includes a substrate, insulating members, first conductive layers, first pillars, and second pillars. The substrate includes a first area, a second area, block regions, and a first dummy block region. The insulating members are arranged at respective boundary portions of the block regions and the first dummy block region. The first conductive layers are partitioned by the insulating members. The first pillars penetrates the first conductive layers in a region where the first area and the block regions overlap. The second pillars penetrates at least one of the first conductive layers in a region where the first area and the first dummy block region overlap.

19 Claims, 18 Drawing Sheets

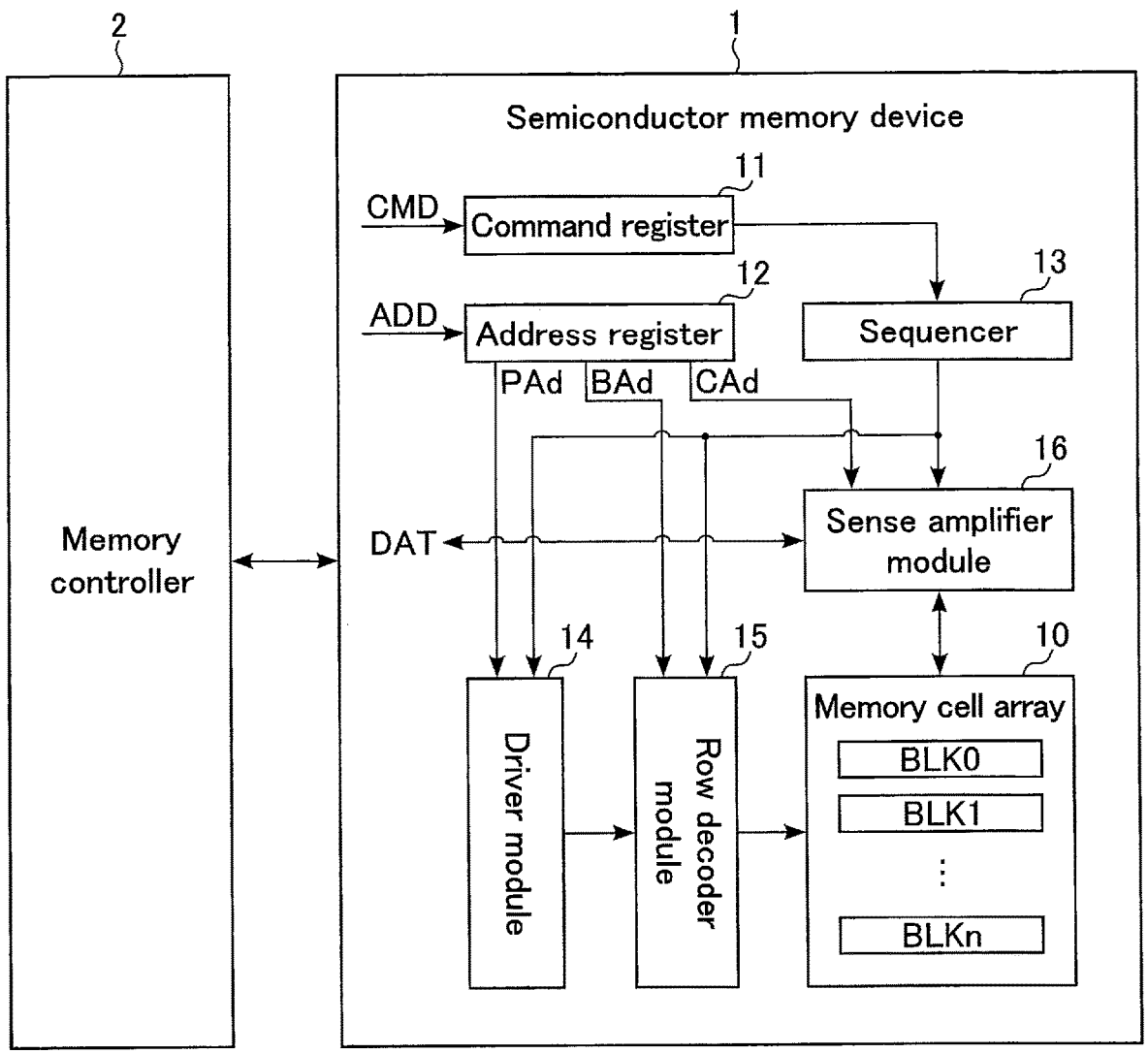
F I G. 1

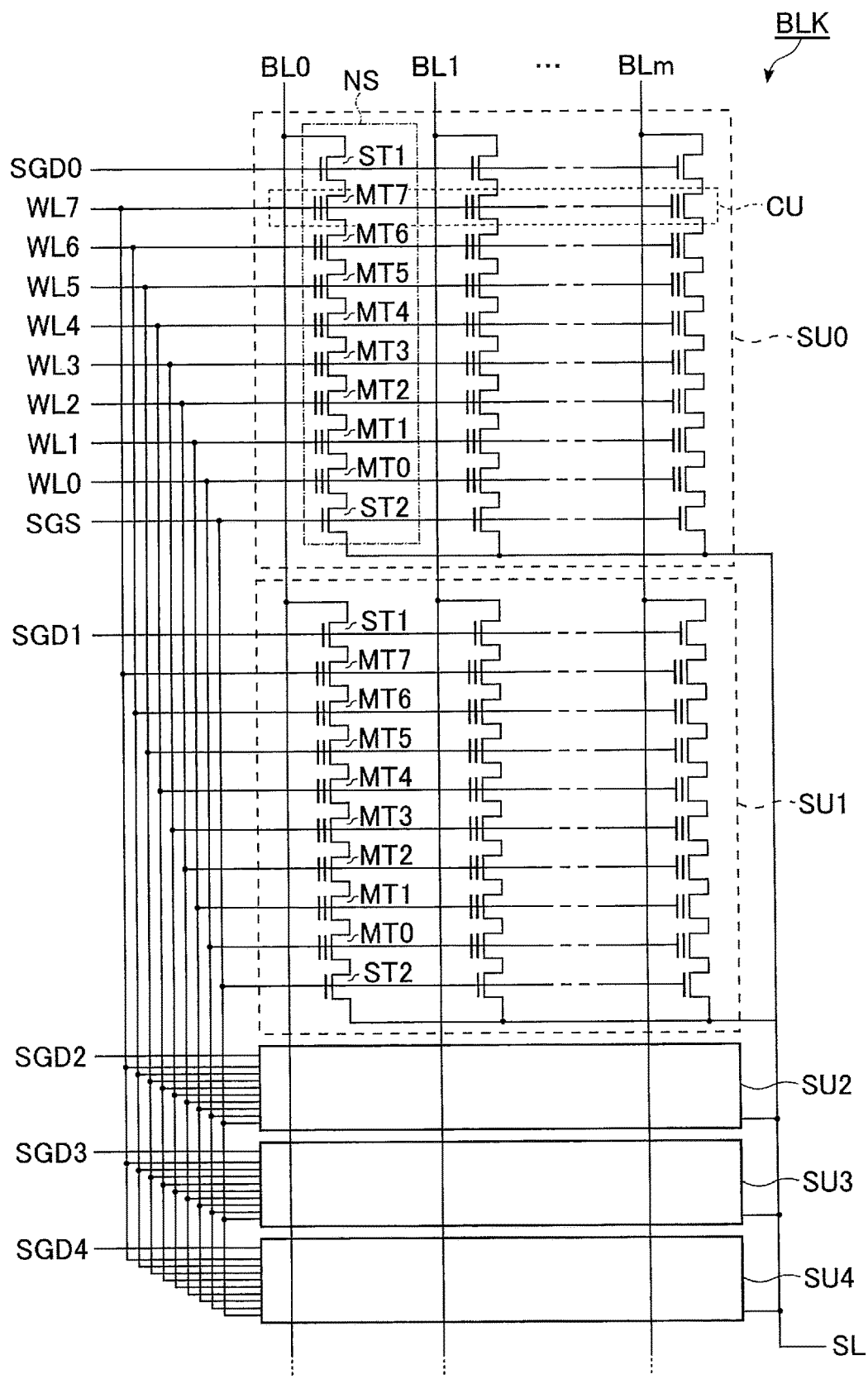
F I G. 2

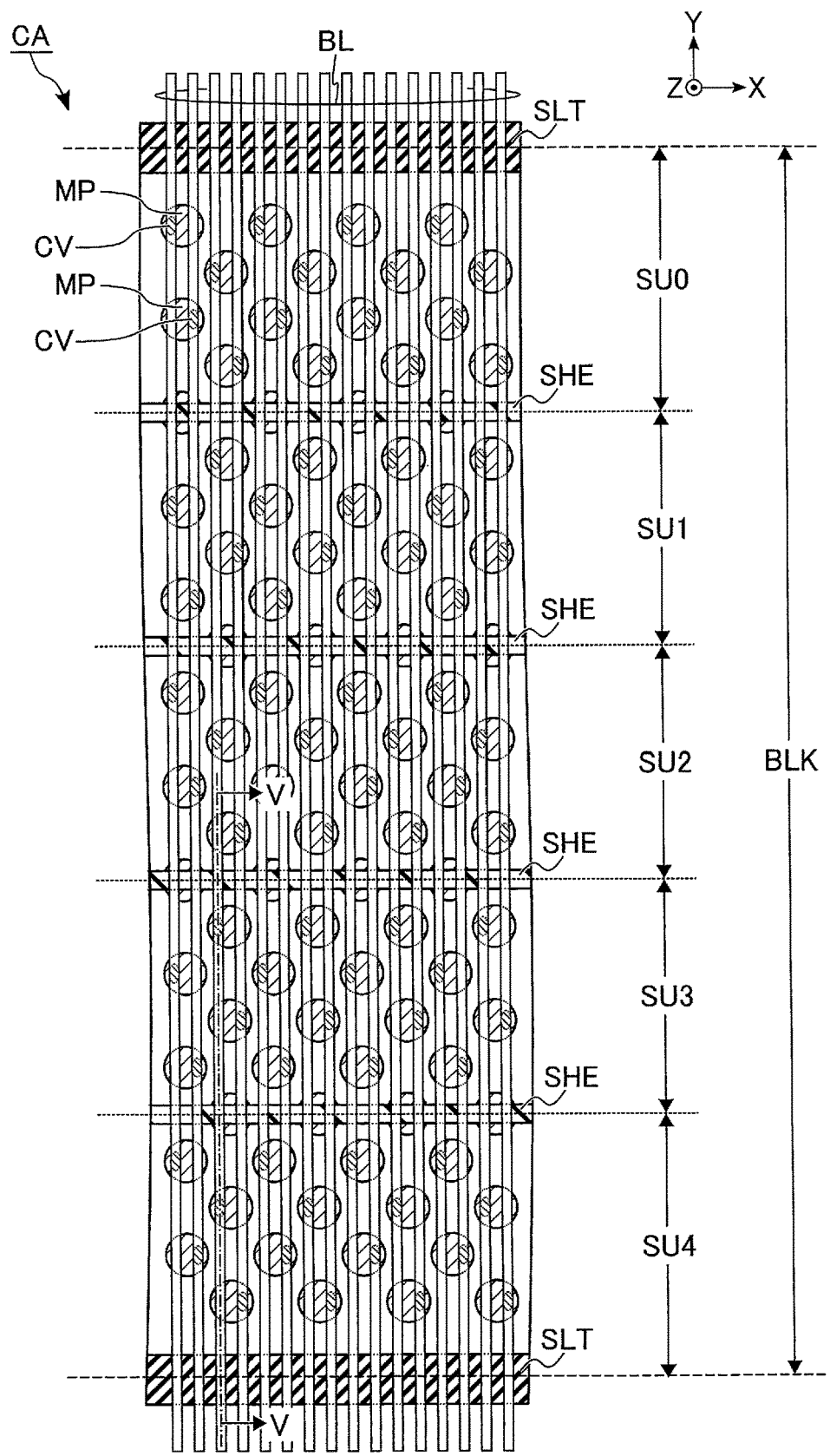
F I G. 4

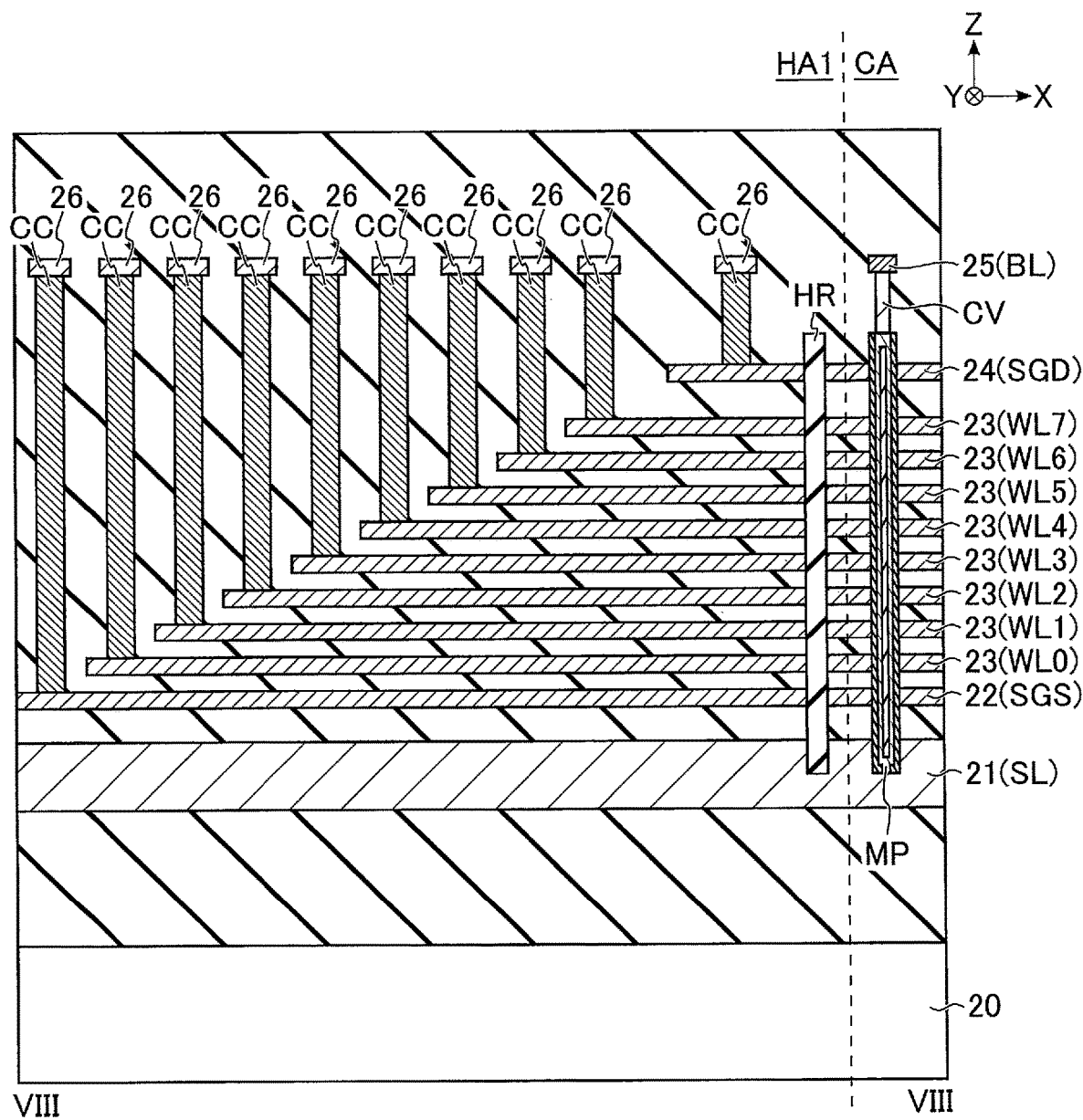
F I G. 8

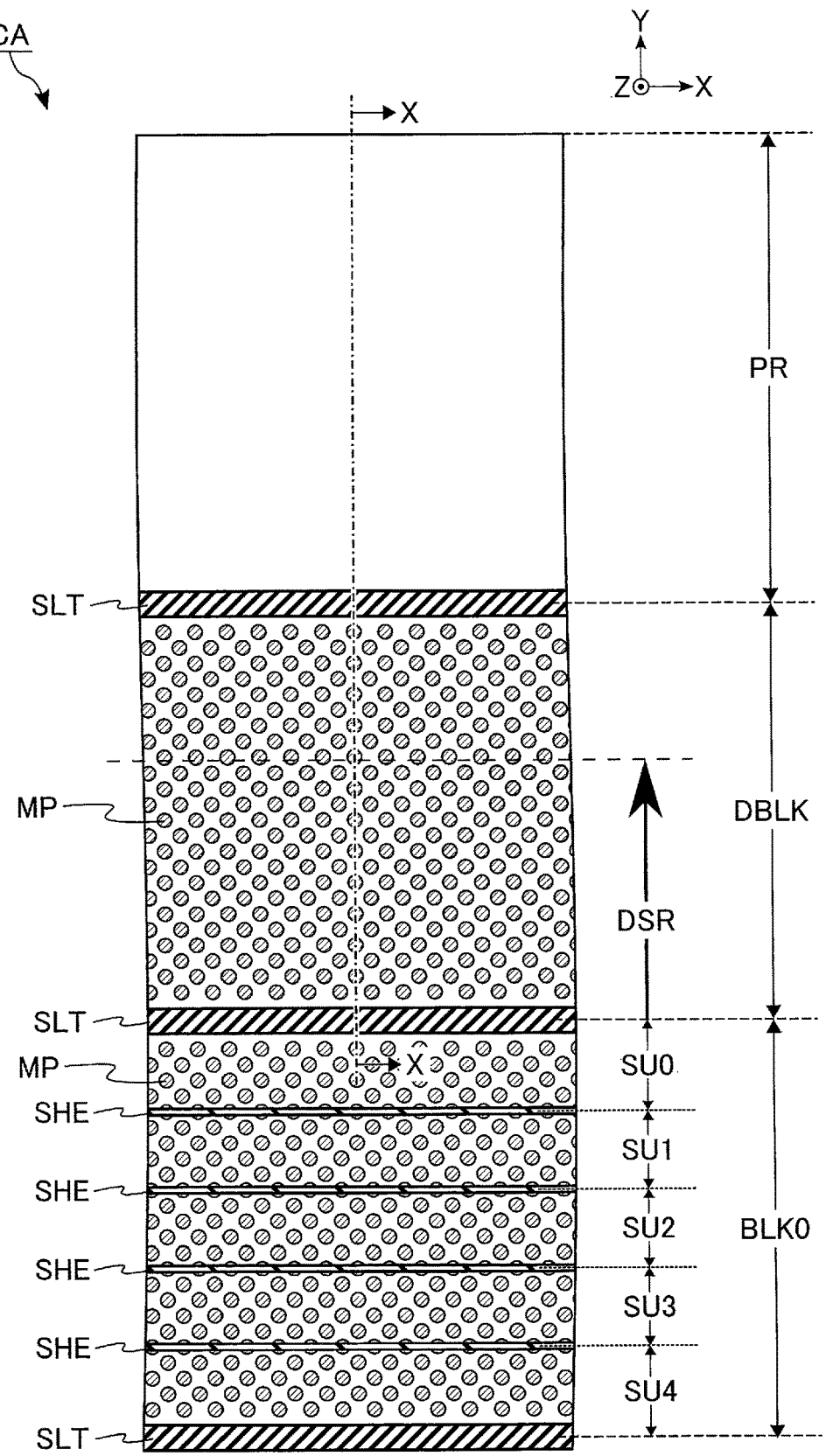
F I G. 9

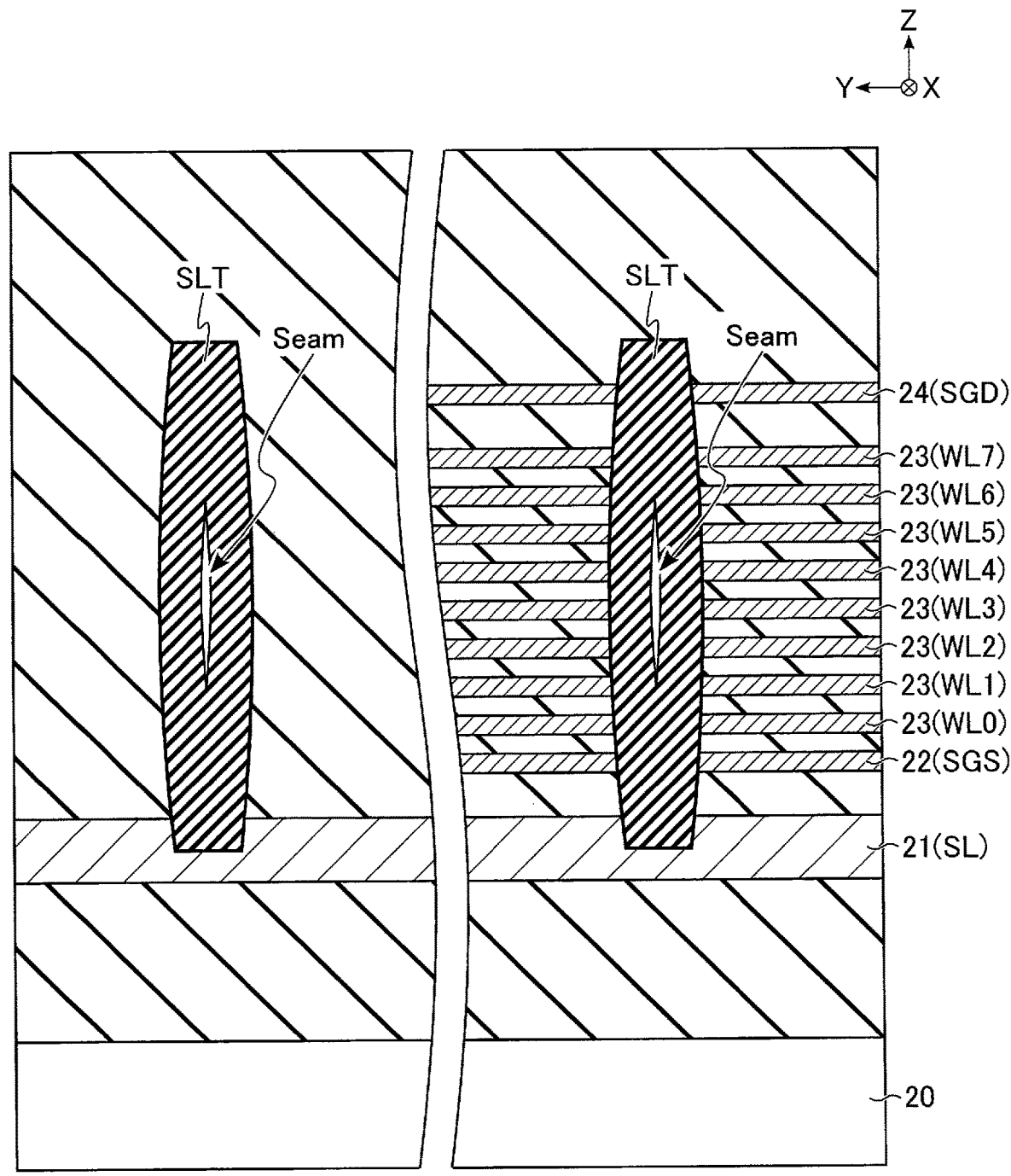
F I G. 18

SEMICONDUCTOR MEMORY DEVICE

CROSS-REFERENCE TO RELATED APPLICATIONS

This application is based upon and claims the benefit of priority from Japanese Patent Application No. 2020-044893, filed Mar. 16, 2020, the entire contents of which are incorporated herein by reference.

FIELD

Embodiments described herein relate generally to a semiconductor memory device.

BACKGROUND

There is known a NAND-type flash memory capable of storing data in a nonvolatile manner.

BRIEF DESCRIPTION OF THE DRAWINGS

FIG. 1 is a block diagram showing an example of an entire configuration of a semiconductor memory device according to an embodiment.

FIG. 2 is a circuit diagram showing an example of a circuit configuration of a memory cell array in the semiconductor memory device according to the embodiment.

FIG. 4 is a plan view showing an example of a detailed planar layout of a cell area of the memory cell array in the semiconductor memory device according to the embodiment.

FIG. 8 is a cross-sectional view, taken along line VIII-VIII in FIG. 7, showing an example of a cross-sectional structure in the hookup area of the memory cell array in the semiconductor memory device according to the embodiment.

FIG. 9 is a plan view showing an example of a planar layout at an end portion of the cell area of the memory cell array in the semiconductor memory device according to the embodiment.

FIG. 18 is a cross-sectional view showing an example of a structure of a slit in the semiconductor memory device according to the embodiment.

DETAILED DESCRIPTION

Figure 3:
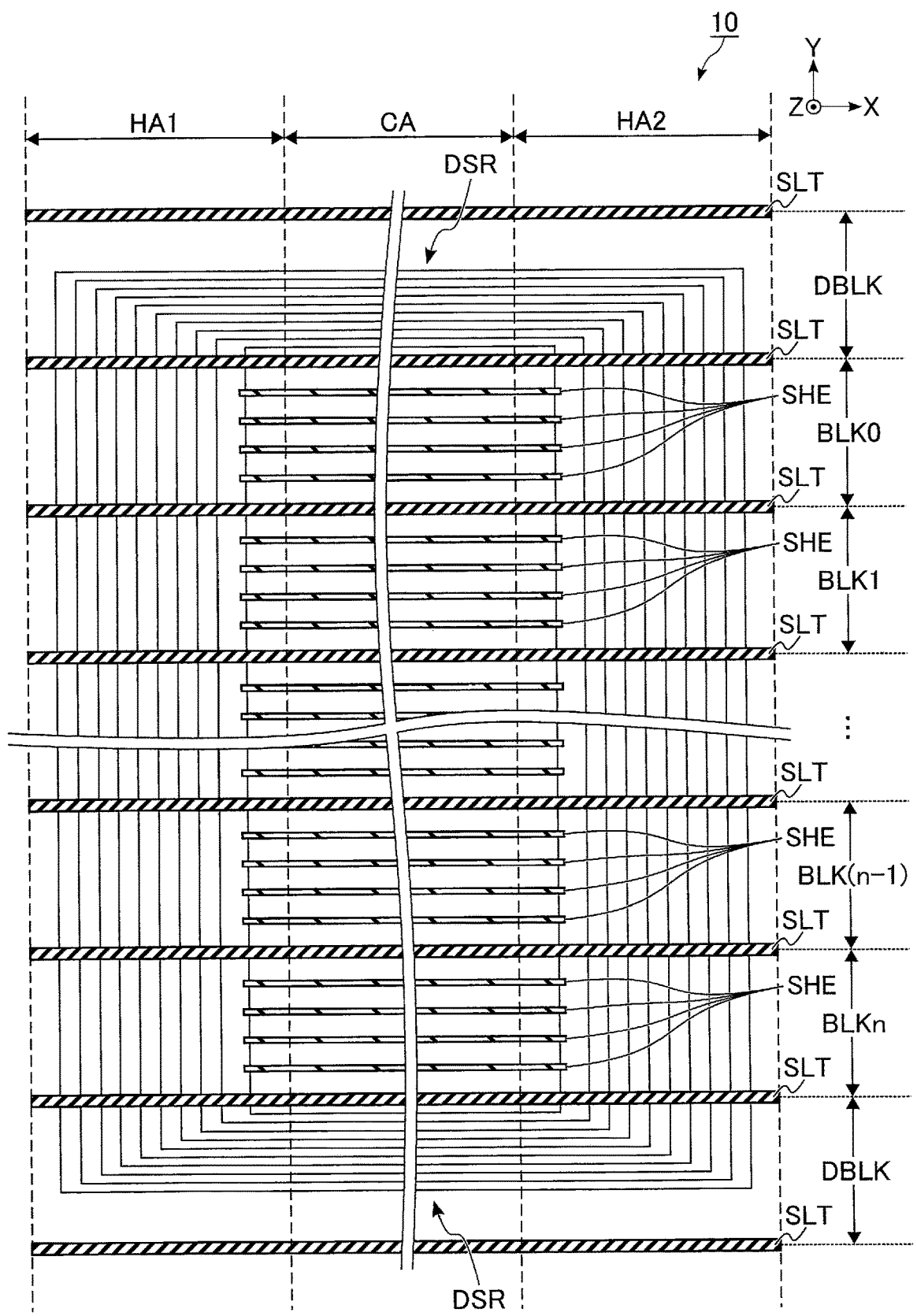
FIG. 3 is a plan view showing an example of a planar layout of the memory cell array in the semiconductor memory device according to the embodiment.

In general, according to one embodiment, a semiconductor memory device includes a substrate, a plurality of insulating members, a plurality of first conductive layers, a plurality of first pillars, and a plurality of second pillars. The substrate includes a first area, a second area, a plurality of block regions, and a first dummy block region. The first area and the second area are arranged in a first direction. The block regions each extend in the first direction and are arranged in a second direction intersecting the first direction. The first dummy block region is adjacent to the block regions in the second direction. The insulating members each extend in the first direction. The insulating members are arranged at respective boundary portions of the block regions and the first dummy block region. The first conductive layers are arranged in a third direction intersecting both the first direction and the second direction and are spaced apart from each other. The first conductive layers are partitioned by the insulating members. The first pillars penetrates the first conductive layers in a region where the first area and the block regions overlap. The second pillars penetrates at least one of the first conductive layers in a region where the first area and the first dummy block region overlap. The first conductive layers include, in the first area, a plurality of first terraced portions, each of which does not overlap an upper first conductive layer, and include, in the second area, a plurality of second terraced portions, each of which does not overlap an upper first conductive layer. Contacts for the first conductive layers are coupled to the second terraced portions. At least one of the first terraced portions is included in the first dummy block region.

An embodiment will be described below with reference to the accompanying drawings. The embodiment exemplifies an apparatus and a method to embody a technical idea of an invention. The drawings are schematic or conceptual, and the dimension and ratio, etc. of each drawing are not necessarily the same as those of the actual implementation.

The technical idea of the present invention is not restricted by the shapes, structures, arrangements, etc., of the structural elements.

In the following descriptions, elements having substantially the same function and configuration will be assigned with the same reference symbol. The numbers after the letters constituting the reference symbols are used to discriminate elements denoted by the reference symbols including the same letters and which have similar configurations. Where there is no need to distinguish between such elements, they are referred to by the reference symbol with the letter only.

Embodiment

A semiconductor memory device 1 according to an embodiment will be described below.

[1] Configuration of Semiconductor Memory Device 1

[1-1] Overall Configuration of Semiconductor Memory Device 1

FIG. 1 shows an example of a configuration of the semiconductor memory device 1 according to the embodiment. The semiconductor memory device 1 is a NAND flash memory capable of storing data in a nonvolatile manner, and may be controlled by an external memory controller 2.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer equal to or greater than 1). A block BLK is a set of memory cells capable of storing data in a nonvolatile manner, and is used, for example, as a data erase unit. A plurality of bit lines and word lines are provided in the memory cell array 10. Each memory cell is, for example, associated with one bit line and one word line. The configuration of the memory cell array 10 will be discussed in detail later.

The command register 11 holds a command CMD received by the semiconductor memory device 1 from the memory controller 2. The command CMD includes, for example, a command for causing the sequencer 13 to execute a read, write, or erase operation, etc.

The address register 12 holds address information ADD received by the semiconductor memory device 1 from the memory controller 2. The address information ADD includes, for example, a block address BAd, a page address PAd, and a column address CAd. For example, the block address BAd, page address PAd, and column address CAd are used for selection of a block BLK, a word line, and a bit line, respectively.

The sequencer 13 controls the overall operation of the semiconductor memory device 1. For example, the sequencer 13 controls the driver module 14, row decoder module 15, and sense amplifier module 16, etc., based on a command CMD held in the command register 11, to execute a read, write, erase operation, etc.

The driver module 14 generates a voltage to be used for the read, write, erase operations, etc. The driver module 14 applies the generated voltage to a signal line corresponding to the selected word line, for example, based on the page address PAd held in the address register 12.

The row decoder module 15 selects the corresponding block BLK in the memory cell array 10, based on the block address BAd held in the address register 12. The row decoder module 15, for example, transfers the voltage applied to the signal line corresponding to the selected word line, to the selected word line in the selected block BLK.

The sense amplifier module 16 applies a desired voltage to each bit line in a write operation, in accordance with write data DAT received from the memory controller 2. Furthermore, in a read operation, the sense amplifier module 16 determines the data stored in a memory cell based on the voltage of the bit line, and transfers the determination result as the read data DAT to the memory controller 2.

The above-described semiconductor memory device 1 and memory controller 2 may be combined into a single semiconductor device. Examples of such semiconductor devices include a memory card such as an SD™ card, and a solid state drive (SSD).

[1-2] Circuit Configuration of Memory Cell Array 10

FIG. 2 shows an example of a circuit configuration of the memory cell array 10 in the semiconductor memory device 1 according to the embodiment, focusing on one of the blocks BLK in the memory cell array 10. As shown in FIG. 2, the block BLK contains, for example, five string units SU0 to SU4.

Each string unit SU includes a plurality of NAND strings NS, each associated with one of the bit lines BL0 to BLm (where m is an integer equal to or greater than 1). Each NAND string NS includes memory cell transistors MT0 to MT7 and select transistors ST1 and ST2. Each memory cell transistor MT includes a control gate and a charge storage layer, and stores the data in a nonvolatile manner. Each of the select transistors ST1 and ST2 is used for selection of a string unit SU in various operations.

In each NAND string NS, the memory cell transistors MT0 to MT7 are coupled in series with each other. The drain of the select transistor ST1 is coupled to the associated bit line BL. The source of the select transistor ST1 is coupled to one end of the serial connection of the memory cell transistors MT0 to MT7. The drain of the select transistor ST2 is coupled to the other end of the serial connection of the memory cell transistors MT0 to MT7. The source of the select transistor ST2 is coupled to a source line SL.

Within a block BLK, the control gates of the memory cell transistors MT0 to MT7 are coupled to the word lines WL0 to WL7, respectively. The gates of a plurality of select transistors ST1 in the string unit SU0 are coupled to a select gate line SGD0. The gates of a plurality of select transistors ST1 in the string unit SU1 are coupled to a select gate line SGD1. The gates of a plurality of select transistors ST1 in the string unit SU2 are coupled to a select gate line SGD2. The gates of a plurality of select transistors ST1 in the string unit SU3 are coupled to a select gate line SGD3. The gates of a plurality of select transistors ST1 in the string unit SU4 are coupled to a select gate line SGD4. The gates of a plurality of select transistors ST2 are coupled to a select gate line SGS.

Different column addresses are assigned to the bit lines BL0 to BLm. Each bit line BL is shared by the NAND strings NS to which the same column address is assigned among a plurality of blocks BLK. A set of word lines WL0 to WL7 is provided for every block BLK. A source line SL is, for example, shared by a plurality of blocks BLK.

A set of memory cell transistors MT commonly coupled to a word line WL in one string unit SU may be referred to as a "cell unit CU". The storage capacity of a cell unit CU including the memory cell transistors MT, each of which stores, for example, 1-bit data, is defined as "1-page data". The cell unit CU may have a storage capacity of 2-page data or more in accordance with the number of bits stored in the memory cell transistors MT.

The circuit configuration of the memory cell array 10 in the semiconductor memory device 1 according to the embodiment is not limited to the above. The number of string units SU in a block BLK and the numbers of memory cell transistors MT and select transistors ST1 and ST2 in a NAND string NS may be any number.

[1-3] Structure of Memory Cell Array 10

An example of a structure of the semiconductor memory device 1 according to the embodiment will be described below. In the drawings mentioned below, the X direction corresponds to the direction of extension of the word lines WL, the Y direction corresponds to the direction of extension of the bit lines BL, and the Z direction corresponds to the direction vertical to the surface of a semiconductor substrate 20, which is used for the formation of the semiconductor memory device 1. The plan views are provided with hatch patterns, as appropriate, to enhance the visibility of the drawings. This hatch pattern, however, may not necessarily relate to the materials or properties of the hatch-lined structural components. In the cross-sectional views, some configurations are omitted as appropriate to enhance the visibility of the drawings.

(Planar Layout of Memory Cell Array 10)

FIG. 3 shows an example of a planar layout of the memory cell array 10 in the semiconductor memory device 1 according to the embodiment. As shown in FIG. 3, the memory cell array 10 has regions corresponding to the blocks BLK0 to BLKn, and regions corresponding to two dummy blocks DBLK, and includes a plurality of slits SLT and a plurality of slits SHE. The planar layout of the memory cell array 10 is, for example, divided in the X direction into a cell area CA and hookup areas HA1 and HA2.

The regions corresponding to the blocks BLK include elements to store data. The regions corresponding to the dummy blocks DBLK are not used for storing data, and are provided for ensuring the shape of the blocks BLK. The blocks BLK0 to BLKn are, for example, arranged between two dummy blocks DBLK. For example, the width of one dummy block DBLK in the Y direction is approximately equal to the width of one block BLK in the Y direction.

The cell area CA is arranged between the hookup areas HA1 and HA2. In regions corresponding to the cell area CA and the blocks BLK, a plurality of NAND strings NS are formed. In regions corresponding to the hookup areas HA and the blocks BLK, a stepped structure of the stacked interconnects (e.g., the word lines WL and select gate lines SGD and SGS) is provided. In the stepped structure, a plurality of contacts for electrically coupling the stacked interconnects coupled to the NAND strings NS and the row decoder module 15 are formed. Hereinafter, in this specification, descriptions will be given by associating a direction in which terrace surfaces of steps are oriented in the stepped structure with an upper direction of the vertical direction.

In each region within the cell area CA and corresponding to the dummy blocks DBLK, and each region within the hookup areas HA and corresponding to the dummy blocks DBLK, a dummy stepped structure is provided. The dummy stepped structure is a stepped structure collaterally formed when the stepped structure within the hookup area HA is formed. Hereinafter, a region including the dummy stepped structure is called "dummy stepped region DSR", and the dummy stepped structure will be described in detail later.

The slits SLT each extend in the X direction, and are arranged at approximately regular intervals in the Y direction. Each slit SLT extends in the X direction across the cell area CA and hookup areas HA1 and HA2. The slits SLT have an insulator structure in which an insulating material is embedded. The slit SLT, for example, partitions the interconnects (e.g., the word lines WL0 to WL7 and select gate lines SGD and SGS) adjacent via the slit SLT.

The slits SHE each extend in the X direction, and are arranged in the Y direction. The slits SHE each extend in the X direction from an end region of the hookup area HA1 to an end region of the hookup area HA2 across the cell area CA. The slits SHE partition at least the select gate lines SGD. In this embodiment, four slits SHE are arranged between any two adjacent slits SLT. The slits SHE have an insulator structure in which an insulating material is embedded. The slits SHE partition the interconnects (at least the select gate lines SGD) that are adjacent via the slit SHE.

In the planar layout of the above-described memory cell array 10, a region sectioned by the slits SLT corresponds to one block BLK or dummy block DBLK. In a region within the cell area CA and corresponding to the block BLK, each region sectioned by the slits SLT and SHE corresponds to one string unit SU. That is, in this example, the string units SU0 to SU4, each extending in the X direction, are aligned in the Y direction for each block BLK.

The planar layout of the memory cell array 10 in the semiconductor memory device 1 according to the embodiment is not limited to the above-described layout. The numbers of slits SHE arranged between any two adjacent slits SLT may be freely designed. The number of string units SU formed between any two adjacent slits SLT is based on the number of slits SHE arranged between the adjacent slits SLT.

(Structure of Memory Cell Array 10 in Cell Area CA)

FIG. 4 shows an example of a detailed planar layout of the cell area CA of the memory cell array 10 in the semiconductor memory device 1 according to the embodiment, focusing on a region including one block BLK (i.e., string units SU0 to SU4). As shown in FIG. 4, the memory cell array 10 includes a plurality of memory pillars MP, a plurality of contacts CV, and a plurality of bit lines BL in the cell area CA.

Each memory pillar MP functions, for example, as a NAND string NS. The memory pillars MP are arranged, for example, in a region between two adjacent slits SLT, in twenty four staggered rows. For example, the slits SHE respectively overlap the memory pillars MP at the fifth, tenth, fifteenth, and twentieth rows counting from the upper side of the drawing sheet.

The bit lines BL each extend in the Y direction, and are arranged in the X direction. Each bit line BL overlaps at least one memory pillar MP in every string unit SU. In the present example, two bit lines BL overlap each memory pillar MP. Between one of the bit lines BL that overlap a memory pillar MP and this memory pillar MP is formed a contact CV. Each memory pillar MP is electrically coupled to a corresponding bit line BL by way of a contact CV.

A contact CV, however, is omitted between a memory pillar MP overlapped by the slit SHE and a bit line BL. That is, a contact CV between a memory pillar MP in contact with two different select gate lines SGD and a bit line BL is omitted. The numbers and arrangement of memory pillars MP, slits SHE, etc. provided between any two adjacent slits SLT are not limited to the configuration explained with reference to FIG. 4, and may be modified as needed. The number of bit lines BL that overlap a memory pillar MP may be freely designed.

Figure 5:
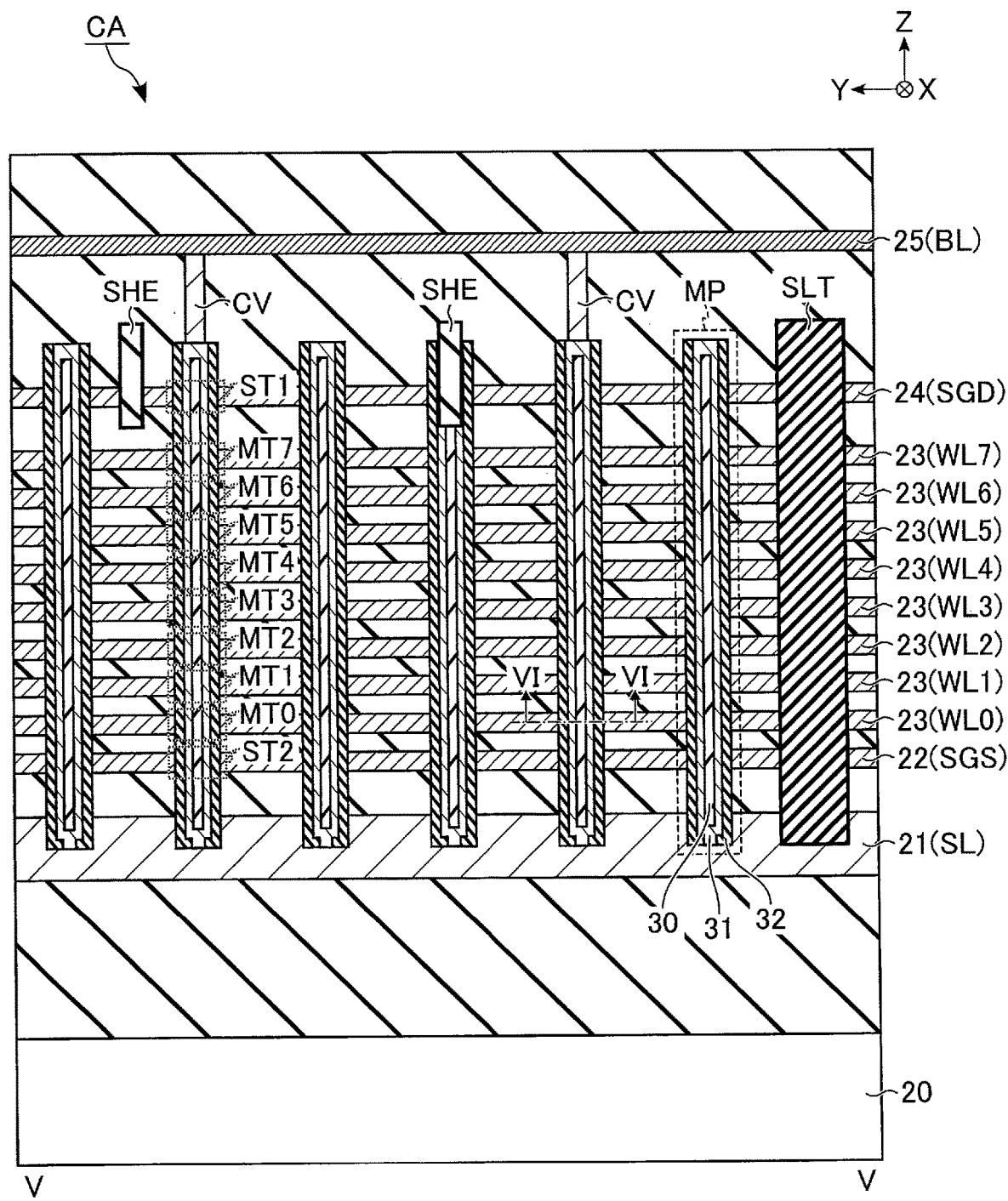
FIG. 5 is a cross-sectional view, taken along line V-V in FIG. 4, showing an example of a cross-sectional structure in the cell area of the memory cell array in the semiconductor memory device according to the embodiment.

FIG. 5 is a cross-sectional view of the structure of FIG. 4 taken along the line V-V, showing an example of a cross-sectional structure of the cell area CA of the memory cell array 10 in the semiconductor memory device 1 according to the embodiment. As shown in FIG. 5, the memory cell array 10 includes conductive layers 21 to 25. The conductive layers 21 to 25 are provided above the semiconductor substrate 20.

Specifically, the conductive layer 21 is provided above the semiconductor substrate 20, with an insulating layer interposed therebetween. Circuits corresponding to the row decoder module 15, the sense amplifier module 16, etc. (not shown), for example, are provided in the insulating layer between the semiconductor substrate 20 and the conductive layer 21. The conductive layer 21 is formed into, for example, a plate expanding along the XY plane, and is employed as a source line SL. The conductive layer 21 may contain phosphorous-doped silicon.

The conductive layer 22 is provided above the conductive layer 21, with an insulating layer interposed therebetween. The conductive layer 22 is formed into, for example, a plate expanding along the XY plane, and is employed as a select gate line SGS. The conductive layer 22 may contain tungsten.

The insulating layers and conductive layers 23 are alternately stacked above the conductive layer 22. The conductive layers 23 are formed into, for example, plates expanding along the XY plane. The stacked conductive layers 23 are employed as word lines, and are respectively referred to as "word lines WL0 to WL7" in ascending order from the semiconductor substrate 20 side. The conductive layers 23 may contain tungsten.

The conductive layer 24 is provided above the uppermost conductive layer 23, with an insulating layer interposed therebetween. The conductive layer 24 is formed into, for example, a plate expanding along the XY plane. The conductive layer 24 may be used as a select gate line SGD. The conductive layer 24 may contain tungsten.

The conductive layer 25 is provided above the conductive layer 24, with an insulating layer interposed therebetween. The conductive layer 25 may be formed into a line extending in the Y direction, and is used as a bit line BL. That is, a plurality of conductive layers 25 are aligned in the X direction in a region not shown in the drawing. The conductive layer 25 may contain copper.

The memory pillars MP extend in the Z direction, and penetrate the conductive layers 22 to 24. Each memory pillar MP includes a core member 30, a semiconductor layer 31, and a stacked film 32.

The core member 30 extends in the Z direction. For example, the top end of the core member 30 is included in a layer above the uppermost conductive layer 24, and the bottom end of the core member 30 is included in a layer in which the conductive layer 21 is provided. The semiconductor layer 31, for example, surrounds the periphery of the core member 30. Part of the semiconductor layer 31 is in contact with the conductive layer 21 at the bottom of the memory pillar MP. The stacked film 32 covers the side and bottom surfaces of the semiconductor layer 31 except for the portion where the semiconductor layer 31 is in contact with the conductive layer 21. The core member 30 may contain an insulator such as silicon oxide. The semiconductor layer 31 may contain silicon.

A pillar-shaped contact CV is provided on the top surface of the semiconductor layer 31 in the memory pillar MP. In the region shown in FIG. 5, two contacts CV respectively corresponding to two memory pillars MP, of the six memory pillars MP, are illustrated. The memory pillars MP not overlapped by the slit SHE and having no contact CV coupled in the region of this drawing, are provided with a contact CV in other regions (not shown).

A single conductive layer 25, or in other words a single bit line BL, is in contact with the top surfaces of the contacts CV. Within each region partitioned by the slits SLT and SHE, a single contact CV is coupled to one conductive layer 25. This means, for example, that one memory pillar MP arranged between adjacent slits SLT and SHE and one memory pillar MP arranged between two adjacent slits SHE are electrically coupled to each conductive layer 25.

A slit SLT is formed into a plate expanding along the XZ plane, and partitions the conductive layers 22 to 24. The top end of the slit SLT is included in a layer arranged between the conductive layer 24 and conductive layer 25. The bottom end of the slit SLT is included in, for example, a level of the layered structure in which the conductive layer 21 is provided. The slit SLT may contain an insulator such as silicon oxide. The slit SLT may include a linear contact. If this is the case, the linear contact may be coupled to the source line SL, and be insulated from the conductive layers 22 to 24.

A slit SHE is formed into a plate expanding along the XZ plane, and partitions the conductive layer 24. The top end of the slit SHE is included in a layer arranged between the conductive layer 24 and the conductive layer 25. The bottom end of the slit SHE is included in, for example, a layer arranged between the uppermost conductive layer 23 and the conductive layer 24. The slit SHE may contain an insulator such as silicon oxide. The top end of the slit SHE may be designed to be aligned with, or unaligned with, the top end of the slit SLT.

In the above-described structure of the memory pillar MP, the intersecting portion of the memory pillar MP and the conductive layer 22 functions as a select transistor ST2. The intersecting portions of the memory pillar MP and the conductive layers 23 function as memory cell transistors MT. The intersecting portion of the memory pillar MP and the conductive layer 24 functions as a select transistor ST1.

Figure 6:
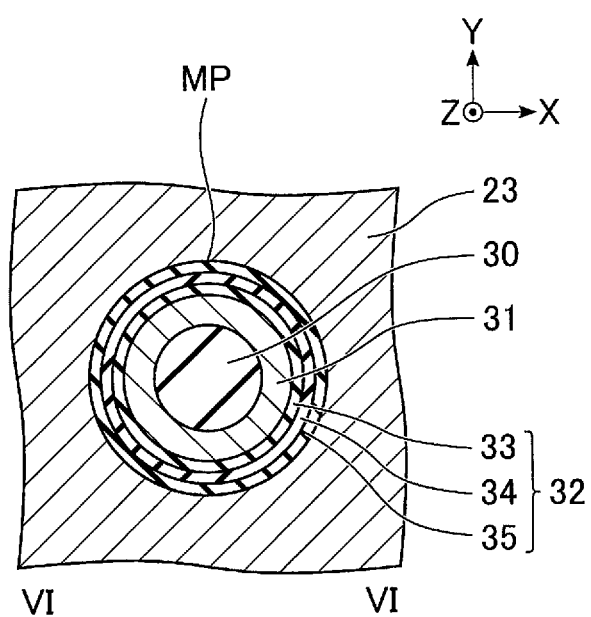
FIG. 6 is a cross-sectional view, taken along line VI-VI in FIG. 5, showing an example of a cross-sectional structure of a memory pillar in the semiconductor memory device according to the embodiment.

FIG. 6 is a cross-sectional view of the structure of FIG. 5 taken along the line VI-VI, showing an example of a cross-sectional structure of a memory pillar MP in the semiconductor memory device 1 according to the embodiment. More specifically, FIG. 6 shows a cross-sectional structure of a memory pillar MP taken along a layer parallel to the surface of the semiconductor substrate 20 and including a conductive layer 23.

As shown in FIG. 6, the stacked film 32 may include a tunnel insulating film 33, an insulating film 34, and a block insulating film 35. In the layer including the conductive layer 23, the core member 30 is arranged, for example, in the center of the memory pillar MP. The semiconductor layer 31 surrounds the peripheral surface of the core member 30. The tunnel insulating film 33 surrounds the peripheral surface of the semiconductor layer 31. The insulating film 34 surrounds the peripheral surface of the tunnel insulating film 33. The block insulating film 35 surrounds the peripheral surface of the insulating film 34. The conductive layer 23 surrounds the peripheral surface of the block insulating film 35.

The semiconductor layer 31 is employed as a channel for the memory cell transistors MT0 to MT7 and select transistors ST1 and ST2. Each of the tunnel insulating film 33 and block insulating film 35 may contain silicon oxide. The insulating film 34 is employed as a charge storage layer for the memory cell transistor MT, and may contain silicon nitride. In this manner, each memory pillar MP functions as a NAND string NS.

(Structure of Memory Cell Array 10 in Hookup Area HA)

In the semiconductor memory device 1 according to the embodiment, the structure of the even-numbered blocks BLK in the hookup area HA1 is similar to the structure of the odd-numbered blocks BLK in the hookup area HA2. The structure of the even-numbered blocks BLK in the hookup area HA2 is similar to the structure of the odd-numbered blocks BLK in the hookup area HA1.

Specifically, for example, the planar layout of the block BLK0 in the hookup area HA2 is the same as that of the block BLK1 in the hookup area HA1 that is reversed in the X direction and Y direction. The planar layout of the block BLK1 in the hookup area HA2 is the same as the structure of the block BLK0 in the hookup area HA1 that is reversed in the X direction and Y direction. Hereinafter, the even-numbered block BLK is called "BLKe", and the odd-numbered block BLK is called "BLKo".

Figure 7:
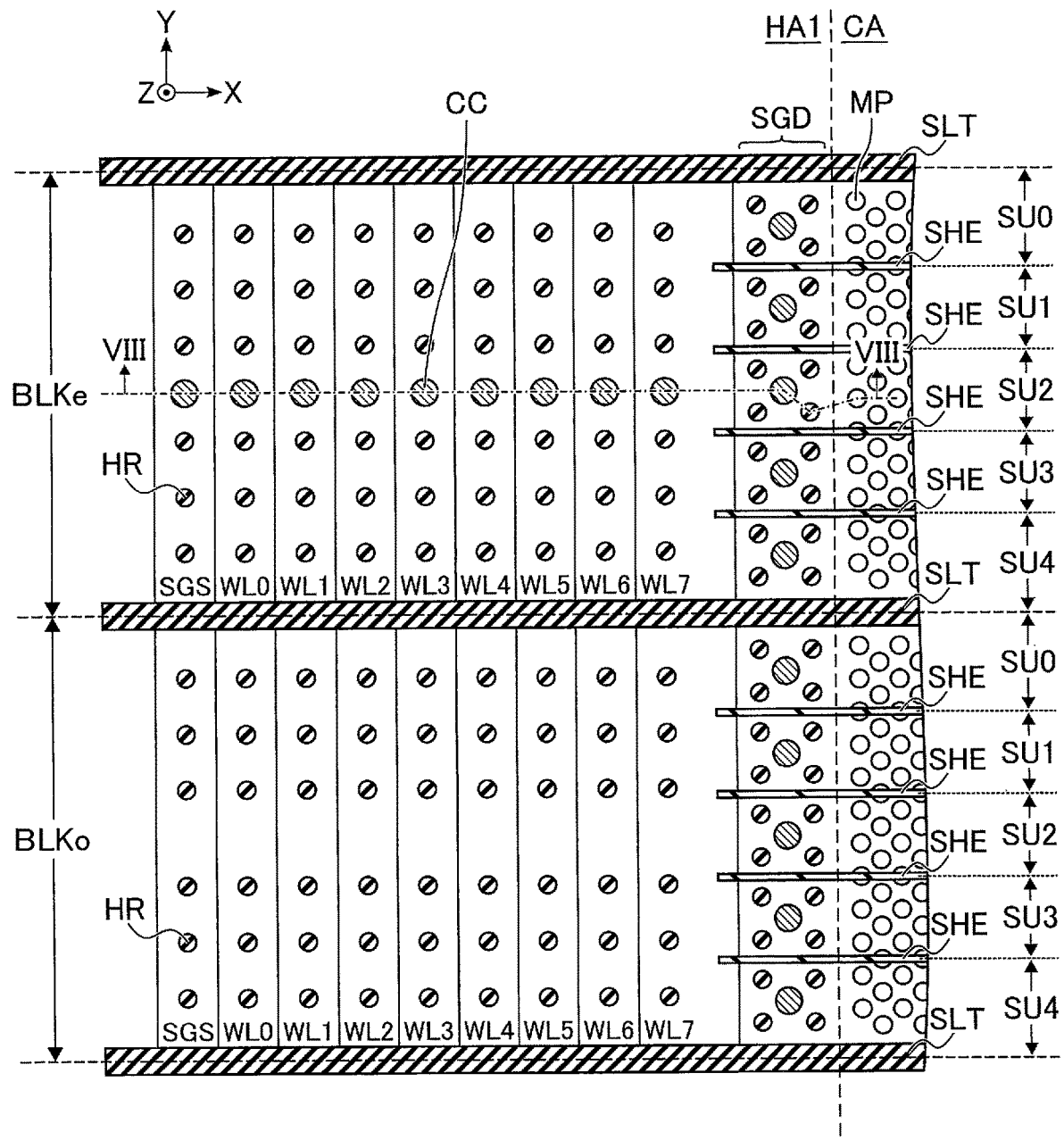
FIG. 7 is a plan view showing an example of a detailed planar layout in a hookup area of the memory cell array in the semiconductor memory device according to the embodiment.

FIG. 7 shows an example of a detailed planar layout of the hookup area HA1 of the memory cell array 10 in the semiconductor memory device 1 according to the embodiment, focusing on a region corresponding to adjacent blocks BLKe and BLKo. FIG. 7 also shows part of the cell area CA in the vicinity of the hookup area HA1. The planar layout of the blocks BLK in the hookup areas HA1 and HA2 will be described below, based on the planar layout of the blocks BLKe and BLKo in the hookup area HA1 shown in FIG. 7.

As shown in FIG. 7, in the hookup area HA1, each of the select gate line SGS, word lines WL0 to WL7, and select gate line SGD includes a portion (terraced portion) that does not overlap the upper interconnect layers (conductive layers). In the hookup area HA1, the memory cell array 10 includes a plurality of contacts CC and support pillars HR.

The portion (terraced portion) not covered by the upper interconnect layers in the hookup area HA1 resembles a step, terrace, or rimstone. Specifically, steps are created between the select gate line SGS and word line WL0, between the word lines WL0 and WL1, . . . , between the word lines WL6 and WL7, and between the word line WL7 and select gate line SGD. In this example, the end portions of the word lines WL0 to WL7 are formed in a staircase pattern in which steps are formed in the X direction.

A plurality of contacts CC are provided on the respective terraced portions of the select gate line SGS, word lines WL0 to WL7 and select gate lines SGD0 to SGD4 in a region within the hookup area HA1 and of the block BLKe. On the other hand, a plurality of contacts CC are provided on the respective terraced portions of the select gate line SGS, word lines WL0 to WL7 and select gate lines SGD0 to SGD4 in a region within the hookup area HA2 and of the block BLKo.

Each of the select gate line SGS, word lines WL0 to WL7, and select gate lines SGD0 to SGD4 is electrically coupled to the row decoder module 15 by way of the corresponding contact CC. That is, a voltage is applied to each of the select gate line SGS, word lines WL0 to WL7, and select gate lines SGD0 to SGD4 from, for example, a contact CC provided in either one of the hookup areas HA1 and HA2.

The contacts CC may further be provided respectively on the terraced portions of the select gate lines SGD0 to SGD4 in the region within the hookup area HA2 and of the block BLKe, and on the terraced portions of the select gate lines SGD0 to SGD4 in the region within the hookup area HA1 and of the block BLKo. If this is the case, a voltage may be applied to the select gate lines SGD from both sides of the contacts CC within the hookup area HA1 and the contacts CC within the hookup area HA2.

The support pillars HR are arranged as appropriate in each of the hookup areas HA1 and HA2, except for the regions where the slits SLT and the contacts CC are formed. In other words, the support pillars HR are arranged so as not to overlap any of the contacts CC and slits SLT. The support pillars HR each have a structure in which an insulating material is embedded in a hole extending in the Z direction, and penetrates the stacked interconnect layers (such as word lines WL and select gate lines SGD and SGS).

FIG. 8 is a cross-sectional view of the structure of FIG. 7, taken along the line VIII-VIII, showing an example of a cross-sectional structure in the hookup area HA1 of the memory cell array 10 in the semiconductor memory device 1 according to the embodiment. FIG. 8 also shows part of the cell area CA in the vicinity of the hookup area HA1. As shown in FIG. 8, in the hookup area HA1, the end portions of the conductive layers 22, 23, and 24 corresponding to the word lines WL and select gate lines SGD and SGS are formed into steps. In the hookup area HA1, the memory cell array 10 includes a plurality of conductive layers 26.

The contacts CC are respectively provided on the terraced portions of the select gate line SGS, word lines WL0 to WL7, and select gate line SGD. One conductive layer 26 is arranged on each contact CC. Thereby, the conductive layers 22, 23, and 24 are electrically coupled to the associated conductive layers 26 through the contacts CC. The conductive layers 26 are included in, for example, the same layer as the conductive layer 25.

The support pillars HR extend in the Z direction, and may penetrate the conductive layers 22 to 24. The top ends of the support pillars HR may be included in a layer between the conductive layer 25 and the top ends of the memory pillars MP. The bottom ends of the support pillars HR may be included in a layer in which the conductive layer 21 is provided.

If a semiconductor layer used as an etching stopper and part of the select gate line SGS is provided between the conductive layer 21 and the conductive layer 22, the bottom ends of the support pillars HR may reach at least the semiconductor layer. In addition, the support pillars HR may be formed by a plurality of kinds of insulating layers, and a conductor or semiconductor may be contained in the support pillars HR as long as the support pillars HR are insulated from the conductive layers 22 to 24.

(Structure of Memory Cell Array 10 at End Portion of Cell Area CA)

FIG. 9 shows an example of a planar layout at an end portion of the cell area CA of the memory cell array 10 in the semiconductor memory device 1 according to the embodiment, focusing on a region including the dummy block DBLK and block BLK0. Hereinafter, a region outside the dummy block DBLK and not including the memory pillars MP, etc. may be called "peripheral region PR."

As shown in FIG. 9, the dummy block DBLK includes, for example, a plurality of memory pillars MP. The memory pillars MP in the dummy block DBLK are arranged, for example, in twenty four staggered rows in the same manner as each block BLK. The slits SHE may be provided in the dummy block DBLK in the same manner as the blocks BLK, or may be omitted. The dummy stepped region DSR is included in the region of the dummy block DBLK. In the embodiment, the dummy stepped region DSR is provided from the vicinity of the slit SLT arranged at the boundary of the block BLK0 and the dummy block DBLK to a region short of the outermost slit SLT.

Figure 10:
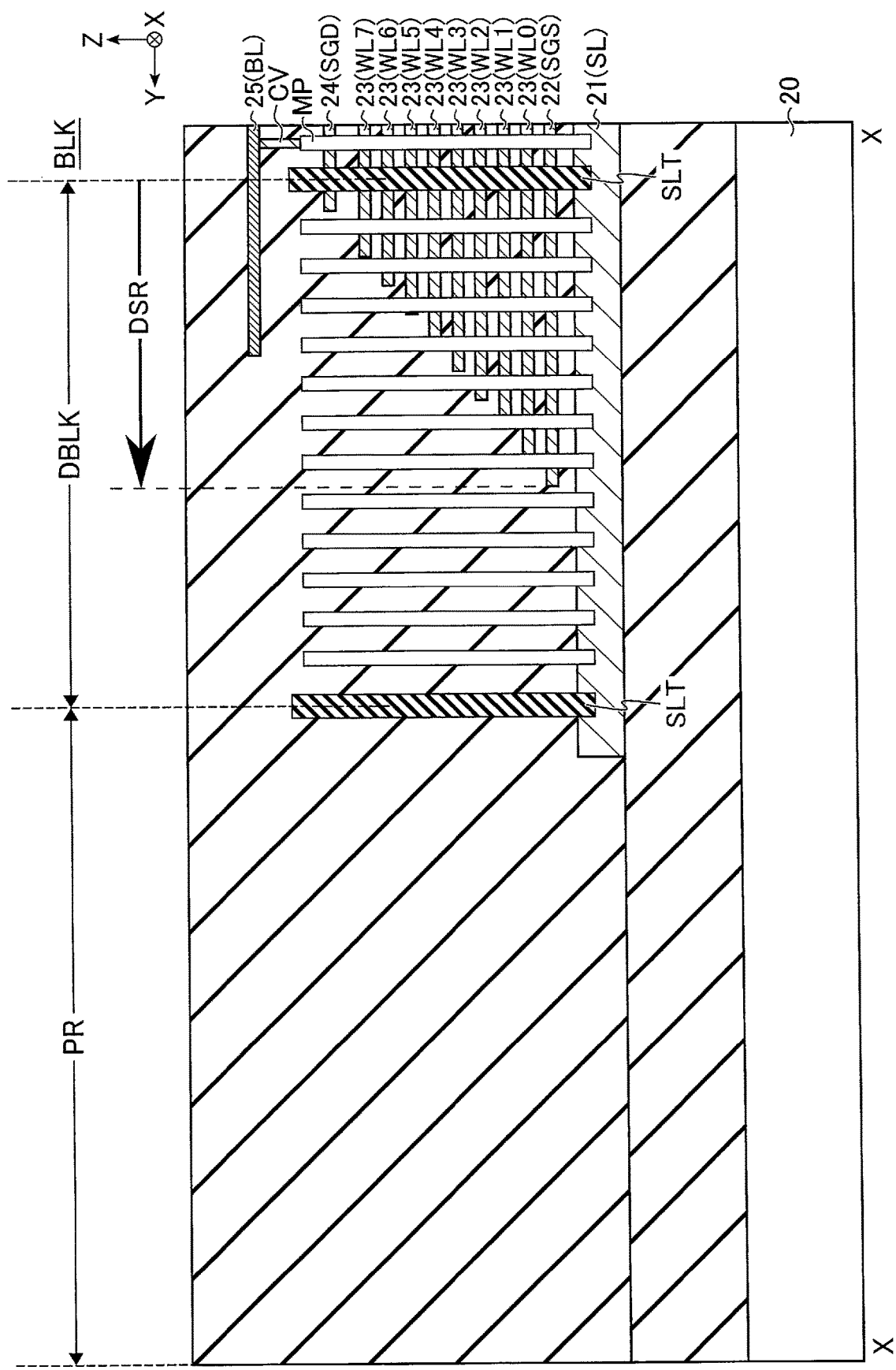
FIG. 10 is a cross-sectional view, taken along line X-X in FIG. 9, showing an example of a cross-sectional structure at the end portion of the cell area of the memory cell array in the semiconductor memory device according to the embodiment.

FIG. 10 is a cross-sectional view of the structure of FIG. 9, taken along the line X-X, showing an example of a cross-sectional structure at the end portion of the cell area CA of the memory cell array 10 in the semiconductor memory device 1 according to the embodiment, focusing on part of the block BLK, the dummy block DBLK, and the peripheral region PR. In the drawings to be referred to below, the structure of the memory pillars MP is simplified as appropriate.

As shown in FIG. 10, the dummy stepped region DSR includes the terraced portions of the stacked interconnects (e.g., the select gate line SGS, word lines WL0 to WL7, and select gate line SOD). Then, the terraced portions of the stacked interconnects are formed into steps. Such a structure in the dummy stepped region DSR corresponds to the dummy stepped structure. The width of the dummy stepped structure in the Y direction can be made narrower than the width of the stepped structure in the hookup area HA in the X direction. The reason for the capability of suppressing the width of the dummy stepped region DSR will be briefly explained below.

For example, in order to form the stepped structure within the hookup area HA, a combination of slimming of a resist and etching of stacked layers is repeatedly executed. Then, the resist used in the combination of slimming and etching may be formed multiple times depending on its durability as a mask. Accordingly, a resist (mask) to be re-formed is, for example, provided not to cover regions of formed terraced portions within the hookup area HA, and to cover regions of formed terraced portions again within the dummy stepped region DSR. This suppresses the expansion of the dummy stepped structure in the Y direction in the dummy stepped region DSR. In this case, steep steps (dummy stepped structure) can be formed in the dummy stepped region DSR.

As for the stepped structure within the hookup area HA, a more complicated stepped structure than the structure shown in the drawing may be formed. Thereby, even if the number of stacked word lines WL increases, for example, a terraced portion of each interconnect layer can be formed while securing terraced portions for the number of stacks in the hookup area HA and suppressing the number of manufacturing steps at the same time. On the other hand, such a complicated stepped structure as in the hookup area HA is unnecessary in the dummy stepped region DSR. Thus, a simple stepped structure having steps in one direction is provided in the dummy stepped region DSR. Also for such a reason, in the semiconductor memory device 1 according to the embodiment, the width of the dummy stepped region DSR is basically provided to be narrower than that of the stepped structure within the hookup area HA.

The peripheral region PR is, for example, entirely covered by an interlayer insulating film formed in a thickness exceeding the top surface of the stacked interconnects of the memory cell array 10. The peripheral region PR may not include a structure similar to the slit SLT except for the slit SLT arranged at the boundary portion with the dummy block DBLK. Although illustration of such is omitted in the drawing, the peripheral region PR can include interconnects or contacts for coupling circuits provided in a layer between the semiconductor substrate 20 and the conductive layer 21, and the stacked interconnects, etc. For example, the bit lines BL can be coupled with the circuits on the semiconductor substrate 20 through the peripheral region PR.

In the semiconductor memory device 1 according to the embodiment, the conductive layer 21 (source line SL) may be provided at least in the block BLK, and may be terminated in any area of the peripheral region PR. The conductive layer 21 in the dummy block DBLK may be omitted, for example, in a case where an etching stopper is provided between the conductive layer 21 and the conductive layer 22.

[2] Effects of Embodiment

According to the semiconductor memory device according to the embodiment described above, it is possible to reduce the chip size of the semiconductor memory device. The effects produced by the semiconductor memory device 1 according to the embodiment will be described in detail below.

In a semiconductor memory device with memory cells three-dimensionally stacked, interconnects, such as word lines WL are stacked. To prepare such stacked interconnects, a replacement process adopting sacrificial members has been known. That is, in the replacement process for the stacked interconnects, insulating films and the sacrificial members are first alternately stacked, and slits are formed to partition the stacked sacrificial members. Then, the sacrificial members are removed through the slits, and conductors are formed in the space created by the removed sacrificial members. In this manner, the stacked interconnects, such as word lines WL, are formed. If the replacement process for the stacked interconnects is executed, the support pillars HR are provided as appropriate in a region where the memory pillars MP are not formed. The support pillars HR are used for sustaining the space created by the removed sacrificial members.

In addition, one of the problems when forming the memory cell array 10 is the difficulty in guaranteeing the shape at a cyclic end of the pattern. In the cyclic pattern of the slits SLT, memory pillars MP, etc., processing unevenness due to etching (e.g., RIE) becomes large at an end portion, which renders it difficult to guarantee the shape. As a method for guaranteeing the shape of the pattern in the block BLK, it is conceivable to form some dummy patterns in the dummy block DBLK or a region outside the dummy block DBLK.

For example, in order to guarantee the shape of the slits SLT, the outermost slit SLT is provided as a dummy slit for guaranteeing the shape of the slit SLT adjacent to the block BLK. Similarly, the dummy memory pillars MP are provided in a predetermined range in order to suppress influence of distortion of an array end on the memory pillars MP within the block BLK.

Figure 11:
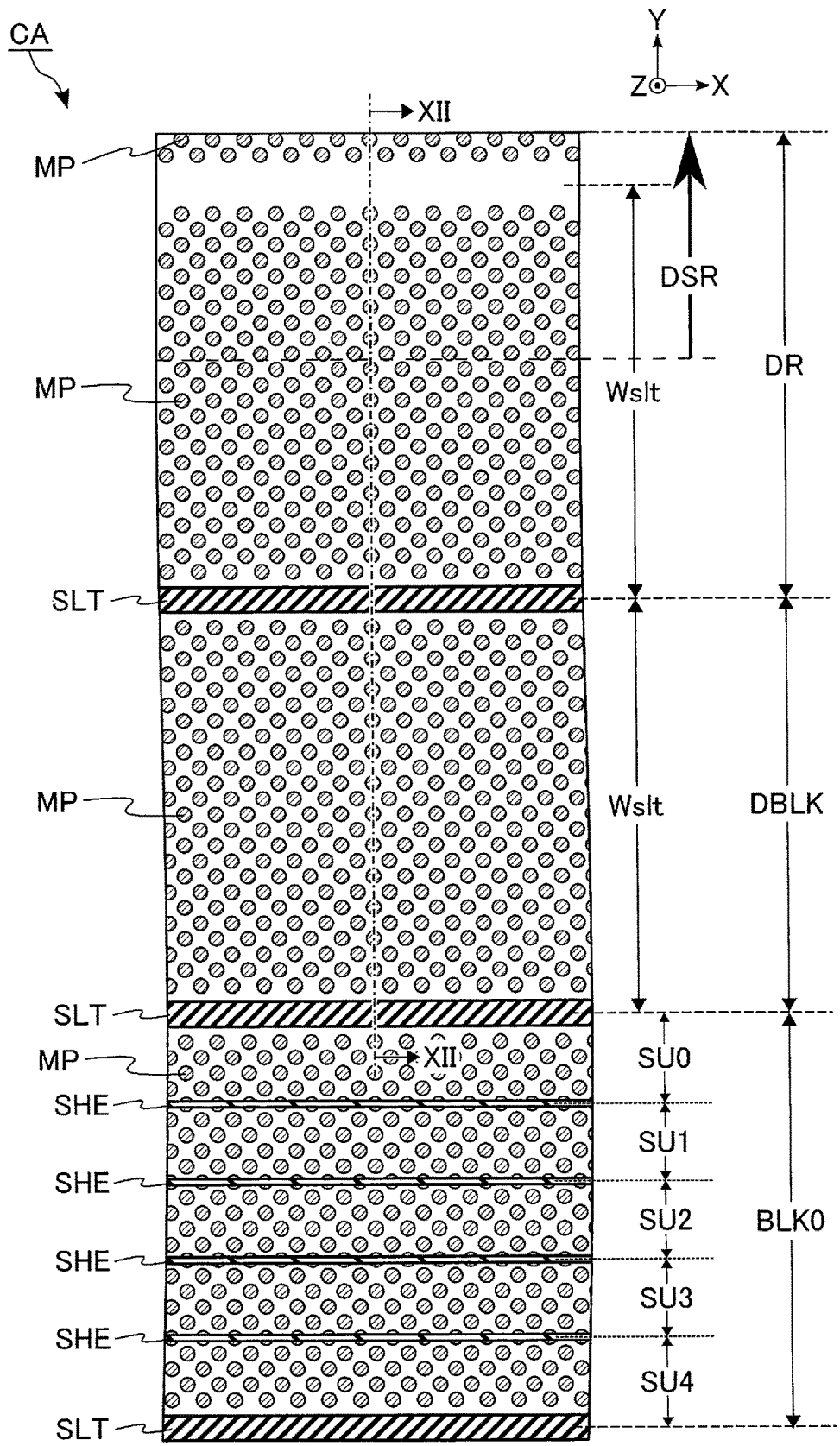
FIG. 11 is a plan view showing an example of a planar layout at an end portion of a cell area of a memory cell array in a semiconductor memory device according a comparative example of the embodiment.

FIG. 11 shows an example of a planar layout at an end portion of a cell area CA of a memory cell array 10 in a semiconductor memory device 1 according to a comparative example of the embodiment, showing an area similar to the area shown in FIG. 9. As shown in FIG. 11, the memory cell array 10 in the comparative example of the embodiment has a structure in which a dummy region DR is added to the outside of the dummy block DBLK with respect to the memory cell array 10 in the embodiment.

The dummy region DR in the comparative example of the embodiment includes a dummy stepped region DSR. The width of the dummy region DR in the Y direction is greater than a width Wslt of the dummy block DBLK in the Y direction. In addition, a plurality of memory pillars MP similar to those in the dummy block DBLK are arranged, for example, so as to be adjacent to the outermost slit SLT. In the dummy region DR, a plurality of memory pillars MP are further provided in a portion over the width Wslt away from the outermost slit SLT.

Figure 12:
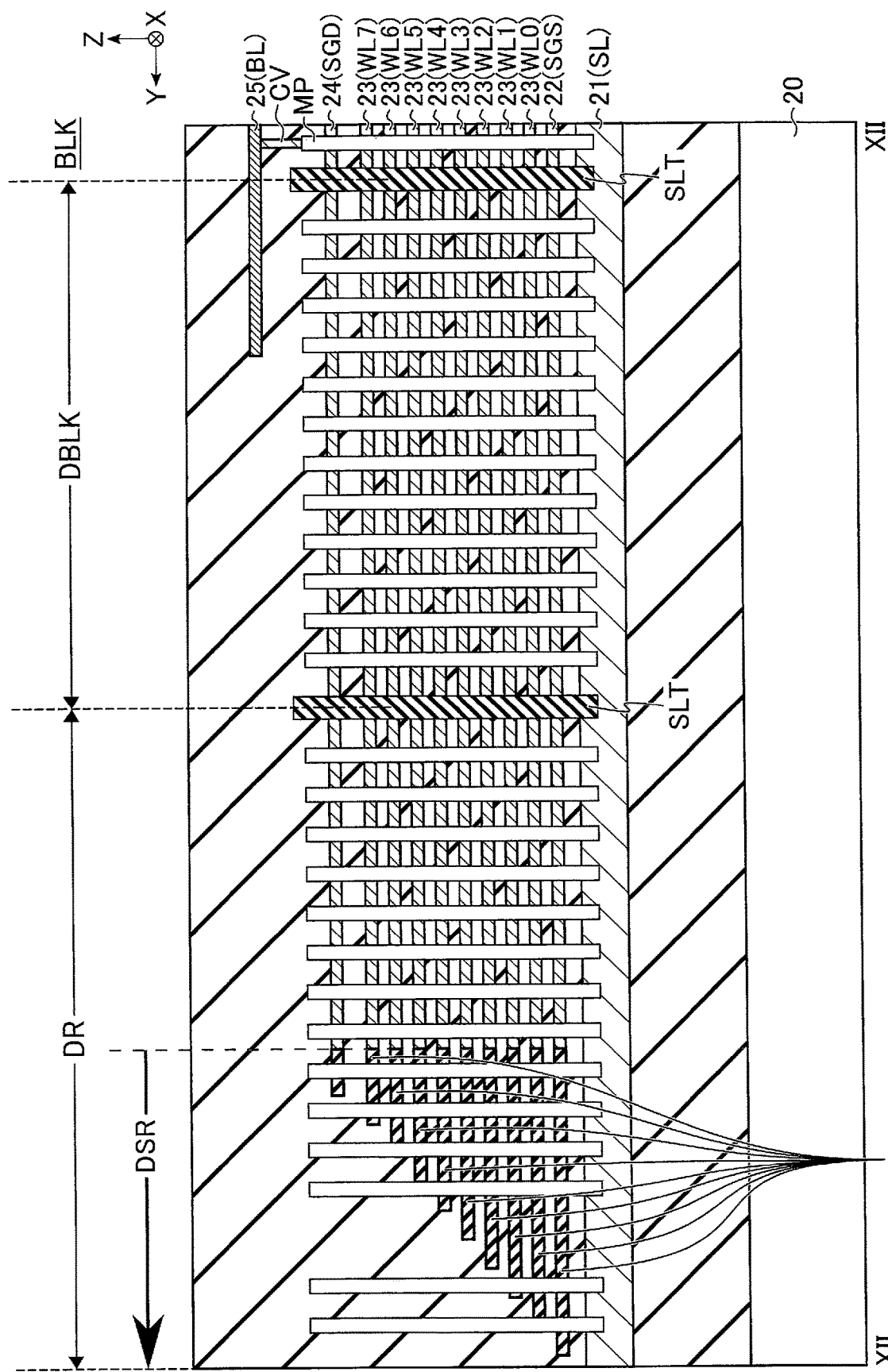
FIG. 12 is a cross-sectional view, taken along line XII-XII in FIG. 11, showing an example of a cross-sectional structure at the end portion of the cell area of the memory cell array in the semiconductor memory device according to the comparative example of the embodiment.

FIG. 12 is a cross-sectional view of the structure of FIG. 11 taken along the line XII-XII, showing an example of a cross-sectional structure at an end portion of the cell area CA of the memory cell array 10 in the semiconductor memory device 1 according to the comparative example of the embodiment, FIG. 12 showing an area similar to the area shown in FIG. 10. As shown in FIG. 12, in the comparative example of the embodiment, for example, in the dummy stepped region DSR, sacrificial members SM are left in layers corresponding to the conductive layers 22 to 24. The sacrificial members SM are members used for a replacement process of stacked interconnects, and materials which are less likely to be left in the blocks BLK.

In the case where the dummy stepped region DSR is included outside the outermost slit SLT like the comparative example of the embodiment, the memory pillars MP used to sustain the space created by removing the sacrificial members SM at the time of the replacement process of stacked interconnects are provided in a predetermined range from the outermost slit SLT. In other words, the memory pillars MP in the dummy region DR are arranged at least in a region where the sacrificial members SM are likely to be removed through the outermost slit SLT. In this manner, a large area not used for storing data is provided in the semiconductor memory device 1 according to the comparative example of the embodiment.

However, forming a large dummy region DR can lead to expansion in chip size, and increase in manufacturing costs of the semiconductor memory device. Since the number of rows of memory pillars MP between two adjacent slits SLT tends to be increased in order to raise a storage capacity per unit area, influence of the chip size expansion due to the enlarged dummy region DR is large. On the other hand, as the number of rows of the memory pillars MP arranged between two adjacent slits SLT increases, so does the distance between the two adjacent slits SLT.

Accordingly, the semiconductor memory device 1 according to the embodiment has the structure in which the dummy stepped region DSR is included in the dummy block DBLK. In other words, the semiconductor memory device 1 according to the embodiment has a structure in which the outermost slit SLT (dummy slit), the opening of which is not guaranteed, is arranged outside the dummy stepped structure. Thus, in the semiconductor memory device 1 according to the embodiment, the arrangement of the memory pillars MP for guaranteeing the shape of the memory pillars MP within the blocks BLK can be omitted outside (peripheral region PR) the outermost slit SLT.

Even in such a case, since the number of rows of the memory pillars MP that can be arranged in the dummy block DBLK is large, it is possible to guarantee the shape of the memory pillars MP within the block BLK. In addition, since the outermost slit SLT in the embodiment is arranged in the same manner as that of the comparative example of the embodiment, it is possible to guarantee the shape of the slit SLT located at the boundary between the dummy block DBLK and the outermost block BLK.

As described above, in the semiconductor memory device 1 according to the embodiment, the shape of the plurality of memory pillars MP provided in the outermost block BLK and the shape of the slit SLT located at the boundary between the dummy block DBLK and the outermost block BLK can be guaranteed, and the dummy pattern outside the dummy block DBLK can be omitted. Therefore, in the semiconductor memory device 1 according to the embodiment, the chip size can be reduced, and manufacturing costs of the semiconductor memory device 1 can be suppressed.

[3] Modification of Embodiment

The semiconductor memory device 1 according to the above-described embodiment can be modified in various ways. Hereinafter, first, second, third, and fourth modifications of the embodiment will be described in order, with respect to different points from the semiconductor memory device 1 according to the embodiment.

[3-1] First Modification

Figure 13:
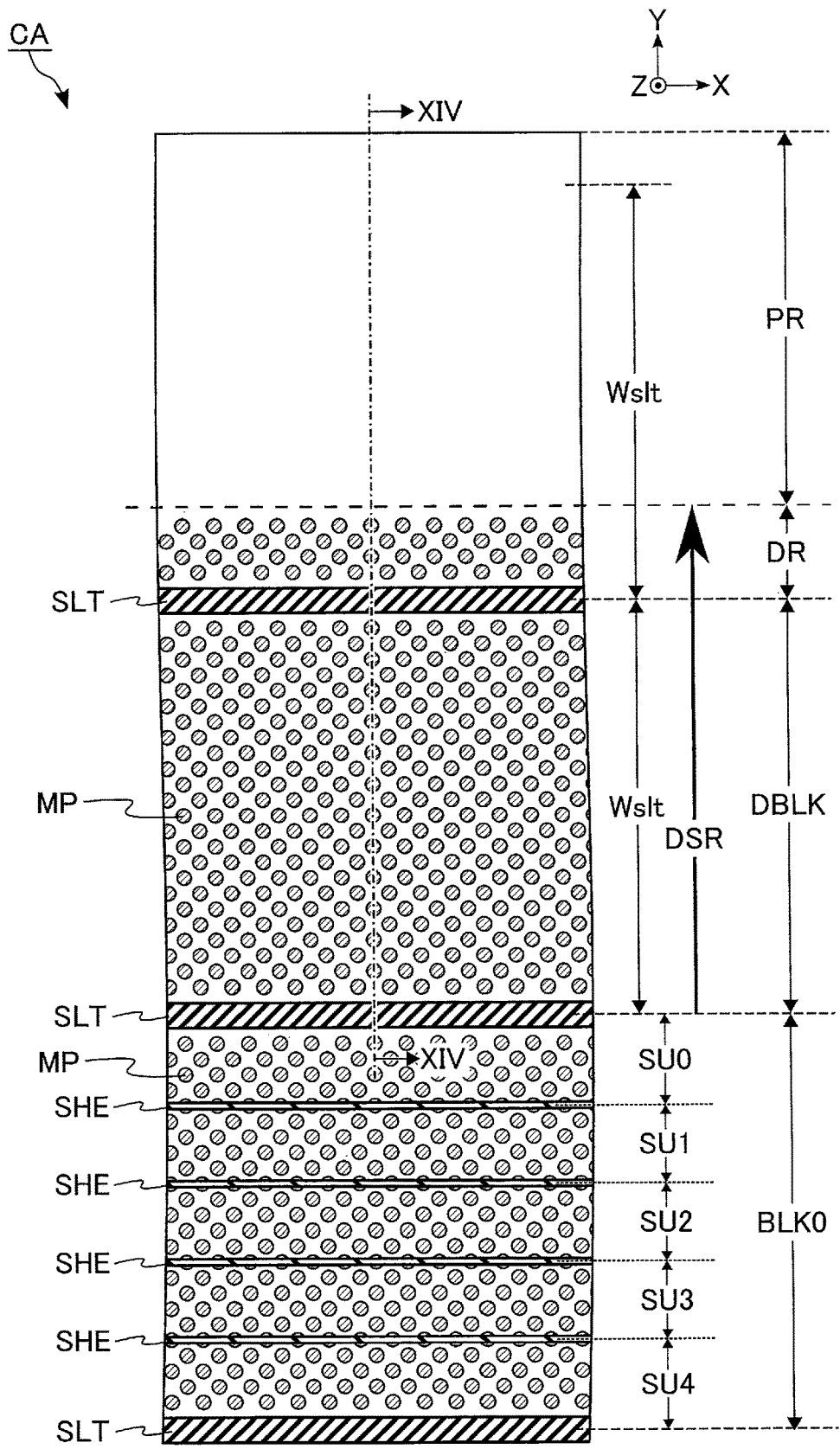
FIG. 13 is a plan view showing an example of a planar layout at an end portion of a cell area of a memory cell array in a semiconductor memory device according to a first modification of the embodiment.

FIG. 13 shows an example of a planar layout at an end portion of a cell area CA of a memory cell array 10 in a semiconductor memory device 1 according to a first modification of the embodiment, FIG. 13 showing an area similar to the area shown in FIG. 9. As shown in FIG. 13, the memory cell array 10 in the first modification of the embodiment has a structure in which a narrower dummy region DR than that of the comparative example of the embodiment is added to the memory cell array 10 in the embodiment.

The dummy region DR includes, for example, a plurality of memory pillars MP. The memory pillars MP within the dummy region DR are arranged, for example, in four staggered rows. In the first modification of the embodiment, the dummy stepped region DSR is provided from the vicinity of the slit SLT, arranged at the boundary of the block BLK0 and the dummy block DBLK, to the boundary between the dummy region DR and the peripheral region PR. That is, in the first modification of the embodiment, an end portion of the dummy stepped region DSR is arranged between the dummy region DR and the peripheral region PR.

The arrangement of the memory pillars MP within the dummy region DR is designed based on the width of the dummy stepped region DSR. For example, as the dummy stepped region DSR increases in width in the Y direction, the width of the dummy region DR in the Y direction is designed to be large. Then, according to the dummy region DR increasing in width in the Y direction, the number of rows of the memory pillars MP is designed to be large.

Figure 14:
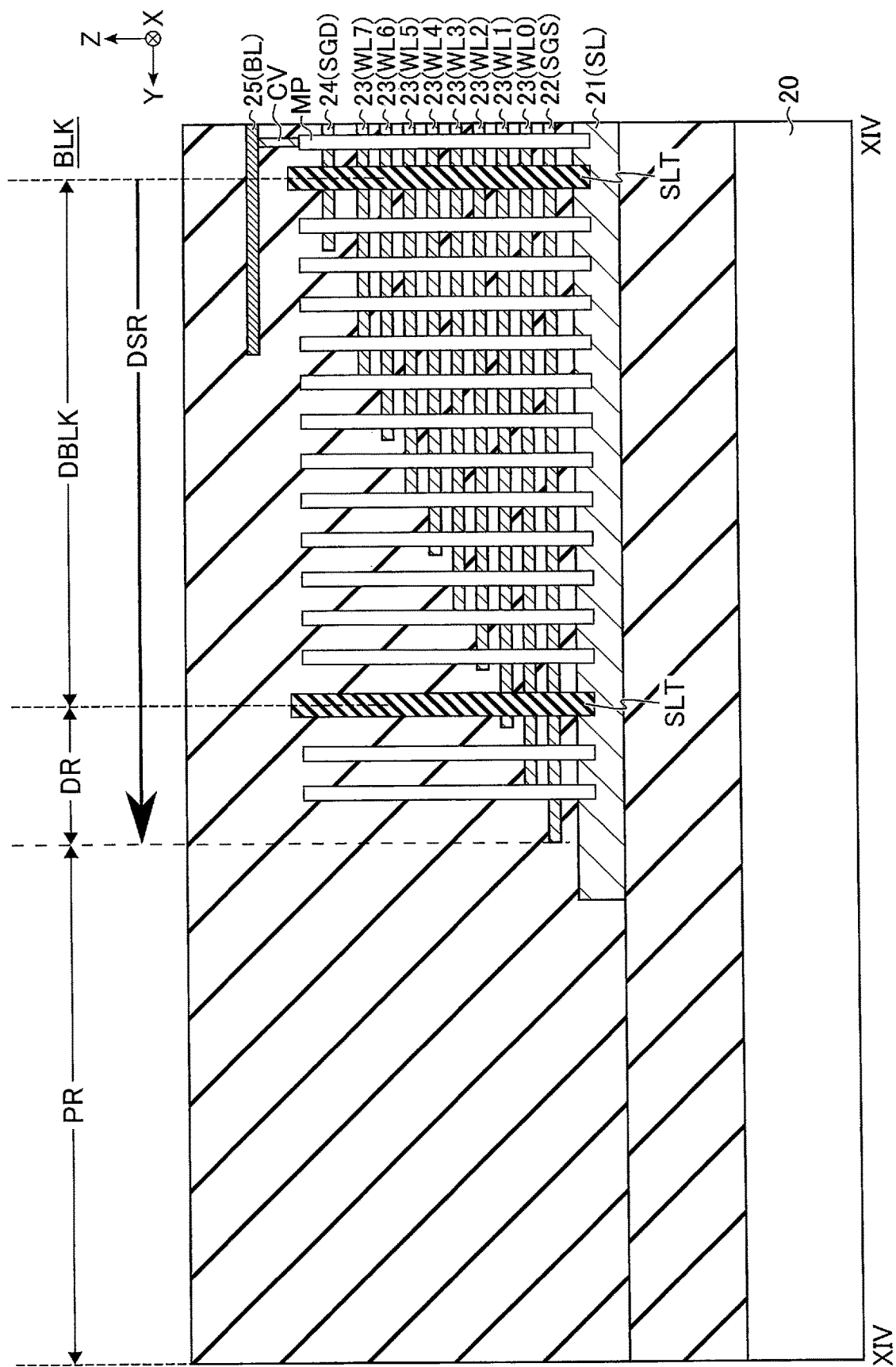
FIG. 14 is a cross-sectional view, taken along line XIV-XIV in FIG. 13, showing an example of a cross-sectional structure at the end portion of the cell area of the memory cell array in the semiconductor memory device according to the first modification of the embodiment.

FIG. 14 is a cross-sectional view of the structure of FIG. 13 taken along the line XIV-XIV, showing an example of a cross-sectional structure at the end portion of the cell area CA of the memory cell array 10 in the semiconductor memory device 1 according to the first modification of the embodiment, FIG. 14 showing an area similar to the area shown in FIG. 10. As shown in FIG. 14, in the first modification of the embodiment, the widths of the terraced portions of the conductive layers 23 in the Y direction are greater than those of the embodiment. Thus, part of the terraced portions of the conductive layers 23 is included outside the outermost slit SLT. Note that the conductive layer 21 (source line SL) may be provided at least in the block BLK, and terminated in any region of the dummy block DBLK, dummy region DR, and peripheral region PR. The other structures of the semiconductor memory device 1 according to the first modification of the embodiment are the same as those of the embodiment.

As described above, the dummy stepped structure may have a large width according to the design of the memory cell array 10. Thus, the semiconductor memory device 1 according to the first modification of the embodiment has a structure in which the dummy stepped region DSR includes the outermost slit SLT. Even in such a case, the semiconductor memory device 1 according to the first modification of the embodiment can obtain the same effects as those of the embodiment by designing so as to minimize the width of the dummy region DR provided outside the outermost slit SLT. That is, in order to obtain the effects explained in the embodiment, the dummy stepped structure may be included in at least the region of the dummy block DBLK.

[3-2] Second Modification

Figure 15:
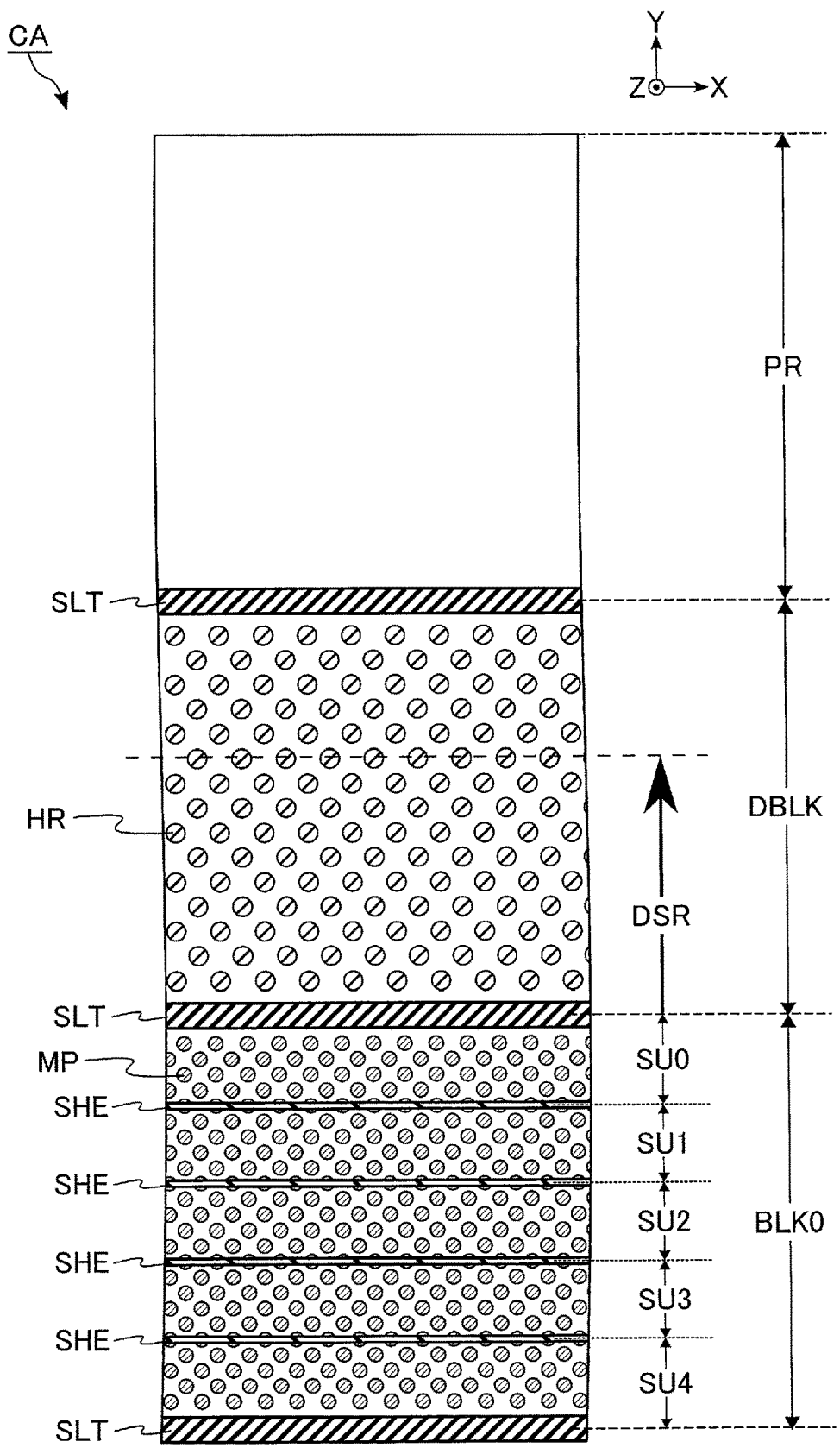
FIG. 15 is a plan view showing an example of a planar layout at an end portion of a cell area of a memory cell array in a semiconductor memory device according to a second modification of the embodiment.

FIG. 15 shows an example of a planar layout at an end portion of a cell area CA of a memory cell array 10 in a semiconductor memory device 1 according to a second modification of the embodiment, FIG. 15 showing an area similar to the area shown in FIG. 9. As shown in FIG. 15, the memory cell array 10 in the second modification of the embodiment has a structure in which the memory pillars MP in the dummy block DBLK are replaced with the support pillars HR, with respect to the memory cell array 10 in the embodiment.

The number of support pillars HR arranged in the dummy block DBLK is less than that of the memory pillars MP arranged in one block BLK. In other words, the pitch of the support pillars HR within the dummy block DBLK is greater than that of the memory pillars MP within the block BLK. In the dummy block DBLK, the support pillars HR are arranged, for example, in fifteen staggered rows. Note that the number of support pillars HR within the dummy block DBLK and that of the memory pillars MP within one block BLK may be compared by the number of rows, or based on the number of arrangement in the Y direction between adjacent slits SLT.

The support pillars HR within the dummy block DBLK each have a structure which includes an embedded insulator in the same manner as the support pillars within the hookup areas HA. In addition, the outer diameter of the support pillar HR within the dummy block DBLK may be greater than that of the memory pillar MP within the block BLK. In other words, in the cross section along the XY plane including a single conductive layer 23, a cross-sectional area of the support pillar HR within the dummy block DBLK may be greater than that of the memory pillar MP within the block BLK. The other structures of the semiconductor memory device 1 according to the second modification of the embodiment are the same as those of the embodiment.

The above-described support pillars HR within the dummy block DBLK are arranged to guarantee the shape of the memory pillars MP within the block BLK (e.g., block BLK0) arranged at the end portion of the memory cell array 10, in the same manner as the memory pillars MP in the dummy block DBLK in the embodiment. As such, the pillars provided in the dummy block DBLK in the semiconductor memory device 1 are not limited to the memory pillars MP, but may be the support pillars HR. Even in such a case, the semiconductor memory device 1 according to the second modification of the embodiment can obtain the same effects as those of the embodiment.

In addition, at the time of forming the memory cell array 10, the dummy block DBLK can include a mixed region of a stacked structure of sacrificial members (e.g., silicon nitride SiN) and insulating layers (e.g., silicon oxide films) corresponding to a stepped structure, and an insulating layer (silicon oxide film) continuous from the interlayer insulating film of the peripheral region PR. Processing is thus rendered extremely difficult since the processing target is different from that in the block BLK, and if the pitch of the support pillars HR within the dummy block DBLK is as fine as that of the memory pillars MP, missing pattern or dust may be generated when processing the support pillars HR.

In contrast, the semiconductor memory device 1 according to the second modification of the embodiment has a structure in which the pitch of the support pillars HR within the dummy block DBLK is moderated. Thereby, the semiconductor memory device 1 according to the second modification of the embodiment can suppress pattern missing or dust which may be generated in the dummy block DBLK. Therefore, the semiconductor memory device 1 according to the second modification of the embodiment can improve yield in the case where the support pillars HR are arranged in the dummy block DBLK.

[3-3] Third Modification

Figure 16:
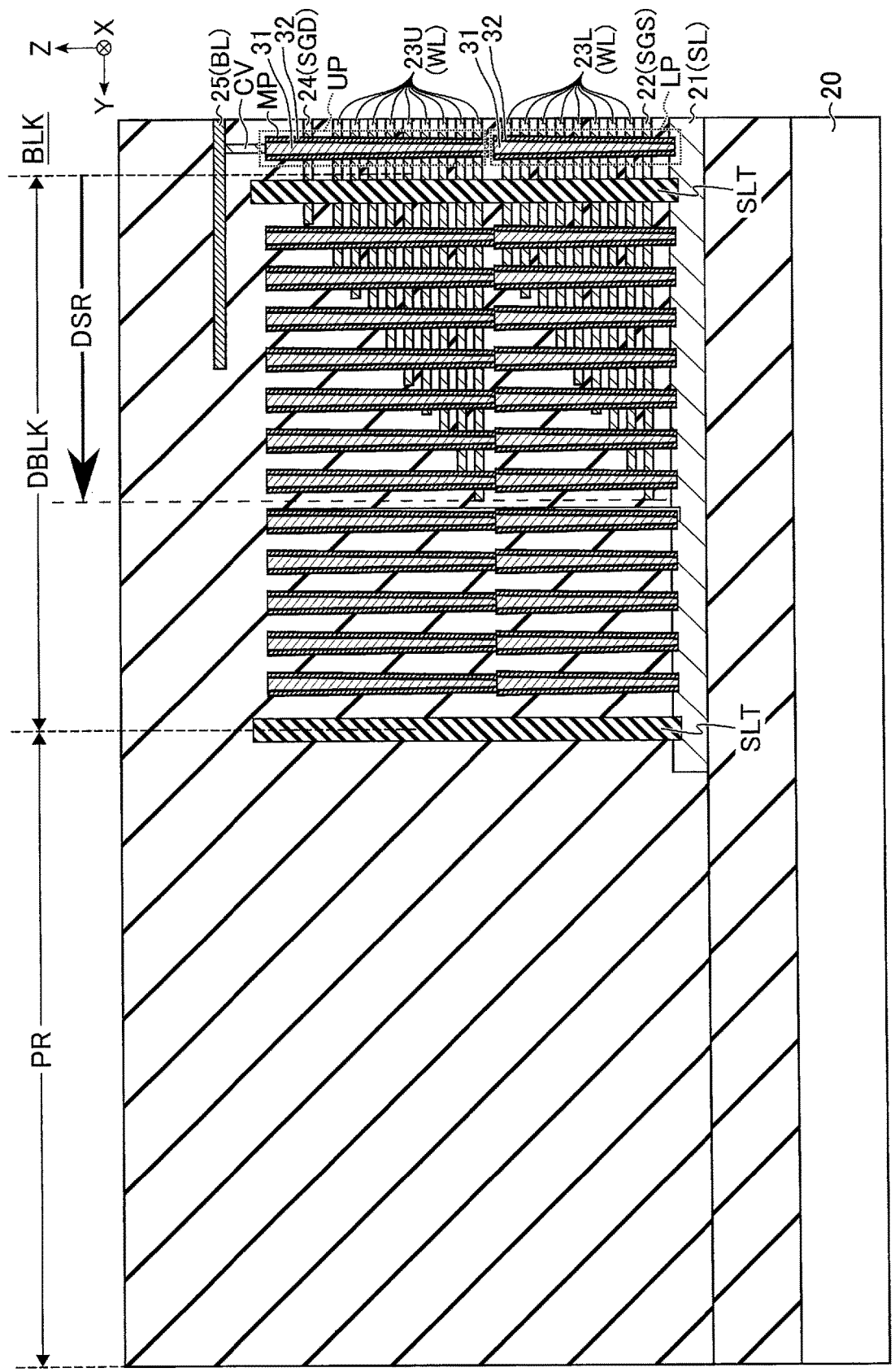
FIG. 16 is a cross-sectional view showing an example of a cross-sectional structure at an end portion of a cell area of a memory cell array in a semiconductor memory device according to a third modification of the embodiment.

FIG. 16 shows an example of a cross-sectional structure at an end portion of a cell area CA of a memory cell array 10 in a semiconductor memory device 1 according to a third modification of the embodiment, FIG. 16 showing an area similar to the area shown in FIG. 10. As shown in FIG. 16, the memory cell array 10 in the third modification of the embodiment includes memory pillars MP each including a plurality of pillars connected in the Z direction.

Specifically, each memory pillar MP in the third modification of the embodiment includes a lower pillar LP and an upper pillar UP. Each of the lower pillar LP and upper pillar UP may have the same layer structure as that of the memory pillar MP described in the embodiment. The lower pillar LP penetrates a plurality of conductive layers 23L (word lines WL) and the conductive layer 22. The upper pillar UP penetrates the conductive layer 24 and a plurality of conductive layers 23U (word lines WL). In the dummy stepped region DSR, a stepped structure of the conductive layers 23L and a stepped structure of the conductive layers 23U may or may not overlap. In other words, the terraced portions of the conductive layers 23L and the terraced portions of the conductive layers 23U may or may not overlap.

In each memory pillar MP, the bottom portion of the lower pillar LP is in contact with the conductive layer 21. The top portion of the lower pillar LP is in contact with the bottom portion of the upper pillar UP. The semiconductor layer 31 within the lower pillar LP and the semiconductor layer 31 within the upper pillar UP are electrically coupled to each other. The semiconductor layer 31 within the lower pillar LP and the semiconductor layer 31 within the upper pillar UP may be formed integrally or individually. The top portion of the upper pillar UP is coupled to the conductive layer 25 by way of a corresponding contact CV. The other structures of the semiconductor memory device 1 according to the third modification of the embodiment are the same as those of the embodiment.

As described above, the memory pillars MP may have a structure in which two pillars are connected in the Z direction. In addition, the memory pillars MP may have a structure in which three or more pillars are connected in the Z direction, or a structure in which a pillar corresponding to the select gate line SGD is connected to a pillar corresponding to the word lines WL. Even in such a case, the semiconductor memory device 1 according to the third modification of the embodiment can obtain the same effects as those of the embodiment.

[3-4] Fourth Modification

Figure 17:
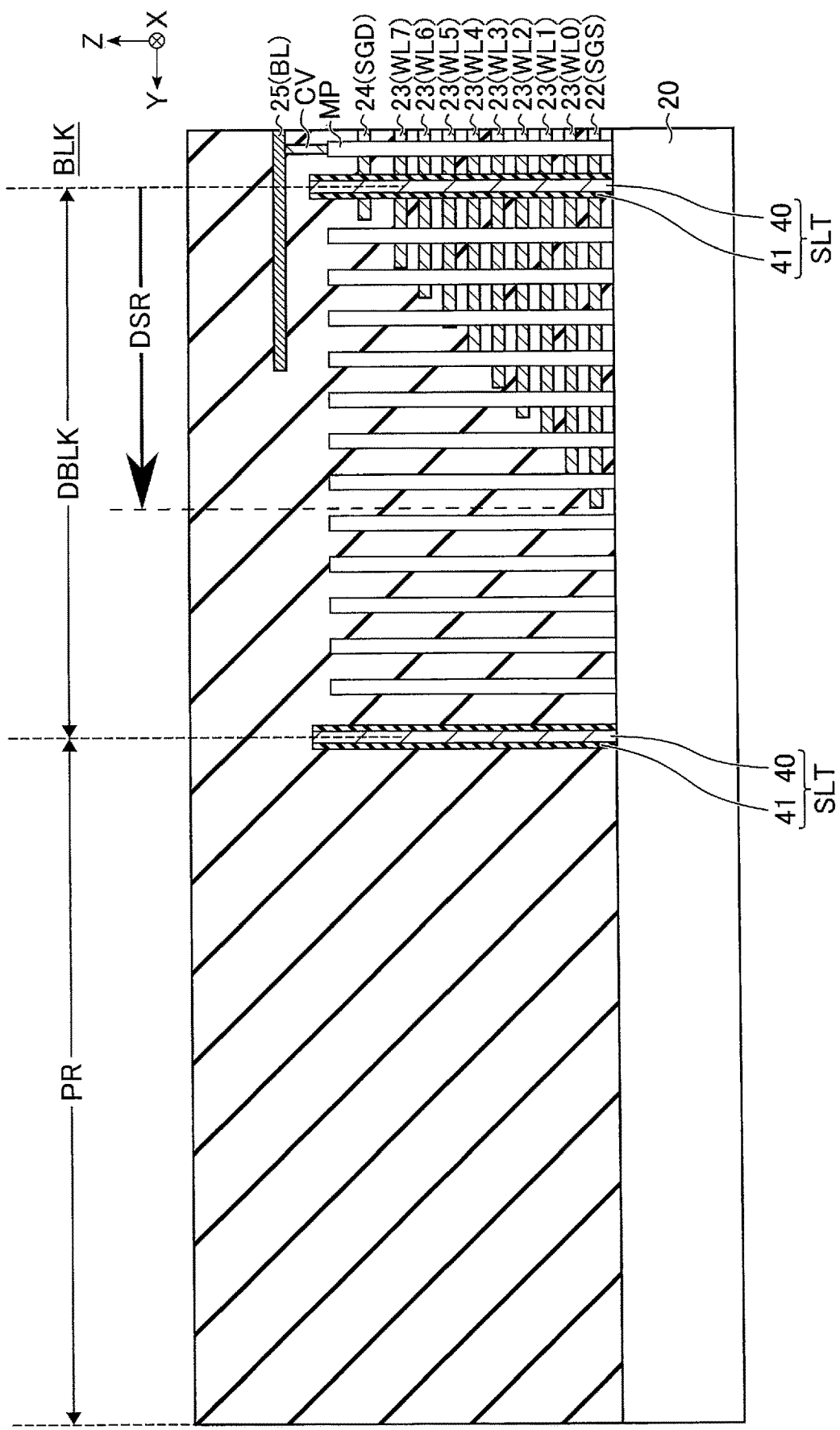
FIG. 17 is a cross-sectional view showing an example of a cross-sectional structure at an end portion of a cell area of a memory cell array in a semiconductor memory device according to a fourth modification of the embodiment.

FIG. 17 shows an example of a cross-sectional structure at an end portion of a cell area CA of a memory cell array 10 in a semiconductor memory device 1 according to a fourth modification of the embodiment, FIG. 17 showing an area similar to the area shown in FIG. 10. As shown in FIG. 17, the memory cell array 10 in the fourth modification of the embodiment has a structure in which the conductive layer 21 corresponding to the source line SL is omitted, and the stacked interconnects of the memory cell array 10 are provided on the semiconductor substrate 20. In addition, in the fourth modification of the embodiment, the structure of the slits SLT is different from that of the embodiment.

Specifically, the conductive layer 22 (select gate line SGS) is provided on the semiconductor substrate 20, with an insulating layer interposed therebetween. On the conductive layer 22, insulating layers and the conductive layers 23 are alternately provided. On the uppermost conductive layer 23, the conductive layer 24 is provided, with an insulating layer interposed therebetween. The memory pillar MP penetrates the conductive layers 22 to 24. The bottom portions of the memory pillars MP are coupled to the semiconductor substrate 20.

The slits SLT in the fourth modification of the embodiment each include a conductor 40 and an insulating film 41. The conductor 40 and insulating film 41 may be formed into a plate expanding along the XZ plane so as to partition the conductive layers 22 to 24. The top end of the conductor 40 is included in a layer between the conductive layer 24 and the conductive layer 25. The bottom end of the conductor 40 is coupled to, for example, an impurity diffusion region provided in the semiconductor substrate 20. The conductive layer 40 may contain a metal, a semiconductor, etc. The insulating film 41 is provided on a side surface of the conductor 40, both isolating and insulating the conductor 40 and the conductive layers 22 to 24. In other words, with respect to the slits SLT in the embodiment, the slits SLT in the fourth modification of the embodiment are each formed to further include the conductor 40 isolated and insulated from the conductive layers 22 to 24 in the Y direction, in the insulator structure expanding along the XZ plane.

In this manner, a line-shaped contact (conductor 40) is provided in the slits SLT in the fourth modification of the embodiment. In this case, the memory pillars MP are coupled to the source line SL through the semiconductor substrate 20 and the conductors 40 in the slits SLT. In addition, in the fourth modification of the embodiment, peripheral circuits, such as the sense amplifier module 16, are provided outside the area of the memory cell array 10.

As described above, the semiconductor memory device 1 may have a structure in which the stacked interconnects, such as the word lines WL, are formed on the semiconductor substrate 20. Even in such a case, the semiconductor memory device 1 according to the fourth modification of the embodiment can obtain the same effects as those of the embodiment. Note that the semiconductor memory device 1 may have a structure in which a chip including the sense amplifier module 16, etc. is adhered to a chip including the memory cell array 10. If such an adhered structure is adopted, a structure corresponding to the semiconductor substrate 20 may be omitted.

[4] Others

A semiconductor memory device according to an embodiment includes a substrate, a plurality of insulating members, a plurality of first conductive layers, a plurality of first pillars, and a plurality of second pillars. The substrate includes a first area, a second area, a plurality of block regions, and a first dummy block region. The first area and the second area are arranged in a first direction. The block regions each extend in the first direction and are arranged in a second direction intersecting the first direction. The first dummy block region is adjacent to the block regions in the second direction. The insulating members each extend in the first direction. The insulating members are arranged at respective boundary portions of the block regions and the first dummy block region. The first conductive layers are arranged in a third direction intersecting both the first direction and the second direction and are spaced apart from each other. The first conductive layers are partitioned by the insulating members. The first pillars penetrates the first conductive layers in a region where the first area and the block regions overlap. The second pillars penetrates at least one of the first conductive layers in a region where the first area and the first dummy block region overlap. The first conductive layers include, in the first area, a plurality of first terraced portions, each of which does not overlap an upper first conductive layer, and include, in the second area, a plurality of second terraced portions, each of which does not overlap an upper first conductive layer. Contacts for the first conductive layers are coupled to the second terraced portions. At least one of the first terraced portions is included in the first dummy block region. Thereby the chip size of the semiconductor memory device can be reduced.

The first to fourth modifications of the embodiment can be combined with each other. Furthermore, three or more kinds of modification may be combined. Even in such a case, the semiconductor memory device 1 can obtain the same effects as those of the embodiment. In the embodiment and each modification, the dummy block DBLK adjacent to the block BLK0 is described, but the same structure can be applied to the dummy block DBLK adjacent to the block BLKn.

In the embodiment, the dummy block DBLK is arranged at the end portion of the memory cell array 10, but the structure is not limited thereto. For example, the dummy block DBLK may be arranged so as to be sandwiched between active blocks BLK in the memory cell array 10. Such a dummy block DBLK may not have a dummy stepped structure. In addition, in such a dummy block DBLK, for example, the memory pillars MP and support pillars HR may be omitted in a region where the sacrificial members SM used for a replacement process of stacked interconnects are left. In this dummy block DBLK, for example, a through-contact, etc. for coupling a circuit between the semiconductor substrate 20 and the stacked interconnects of the memory cell array 10, and a circuit of an upper layer of the stacked interconnects, can be provided.

In the drawings used for explanation in the embodiment, the memory pillars MP and support pillars HR are illustrated as having the same diameter straight in the Z direction. The shape, however, is not limited thereto. For example, the memory pillars MP and support pillars HR may be tapered or reverse tapered, or may be bulged in the middle (bowing shape). Similarly, the slits SLT and SHE may be tapered or reverse tapered, or may have a bowing shape. Moreover, in the embodiment, the memory pillars MP, support pillars HR, and contacts CC have a circular cross section. However, the cross section of each component may be ellipsoidal, or indeed any shape.

In the embodiment, various types of insulating materials may be adopted to fill the slits SLT. If a slit SLT is formed of an insulator, for example, when the slit SLT is arranged in an interlayer insulating film, as with the outermost slit SLT in the embodiment, it becomes difficult to distinguish from the peripheral insulating film itself. Here, an example of a method for identifying a slit SLT is explained. FIG. 18 shows an example of a structure of the slits SLT in the semiconductor memory device 1 according to the embodiment, showing a slit SLT that partitions the stacked interconnects and a slit SLT that does not partition the stacked interconnects.

As shown in FIG. 18, if the processed slit SLT has a bow shape, the insulator may not be completely embedded in the slit SLT. In other words, the slit SLT may have a seam. In such a case, the position of the slit SLT may be identified based on the position of the seam of the insulating film. The case is not limited thereto, and the same applies to cases where a seam is formed in a slit SLT having other shapes.

Furthermore, part of the materials used in the replacement process of the stacked interconnects may be left on a side wall of the slit SLT. For example, if tungsten is used for the stacked interconnects, a thin film of alumina can be formed prior to the formation of tungsten. In this case, alumina can be left at the boundary portion between the slit SLT and the peripheral interlayer insulating film. That is, the position of the slit SLT may be identified based on part of the materials used in the replacement process of the stacked interconnects.

In the embodiment, the memory cell array 10 includes two hookup areas HA1 and HA2, but the structure is not limited thereto. In the memory cell array 10, at least one hookup area HA may be provided. In this case, the hookup area HA may be provided adjacent to the cell area CA, or in the middle portion of the cell area CA. In addition, a contact area for coupling upper and lower interconnects of the memory cell array 10 may be provided in the memory cell array 10. In this case, for example, a contact penetrating the stacked interconnects of the memory cell array 10 is provided in the contact area.

In the embodiment, the end portions of the word lines WL0 to WL7 are formed in a staircase pattern having only steps in the X direction in the hookup area HA, but the structure is not limited thereto. For example, steps in the Y direction may further be formed to provide terraced portions. The number of steps formed at the end portions of the stacked word lines WL in the X and Y directions can be designed to be any number. In other words, the end portions of the word lines WL in the hookup area HA can be designed as any stepped structure having any number of rows in the semiconductor memory device 1.

The term "coupled/connected" throughout the specification refers to electrical coupling, and therefore it may include coupling with some other elements interposed therebetween. The expression "electrically coupled" may refer to the coupling of components with an insulator interposed therebetween as long as the operation can be conducted in the same manner as when being electrically coupled. A "pillar" refers to a structure provided in a hole formed in the process of manufacturing the semiconductor memory device 1. A "same layer structure" may consist of layers formed at least in the same order.

An "area" may be a structure included in the semiconductor substrate 20 throughout the specification. For example, when the semiconductor substrate 20 is defined as including the cell area CA and hookup areas HA1 and HA2, the cell area CA and hookup areas HA1 and HA2 are respectively associated with different areas above the semiconductor substrate 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate including a first area, a second area, a plurality of block regions, and a first dummy block region, the first area and the second area being arranged in a first direction, the block regions each extending in the first direction and being arranged in a second direction intersecting the first direction, and the first dummy block region being adjacent to the block regions in the second direction;
a plurality of insulating members each extending in the first direction, the insulating members being arranged at respective boundary portions of the block regions and the first dummy block region;
a plurality of first conductive layers arranged in a third direction intersecting both the first direction and the second direction and spaced apart from each other, the first conductive layers being partitioned by the insulating members;
a plurality of first pillars penetrating the first conductive layers in a region where the first area and the block regions overlap; and
a plurality of second pillars penetrating at least one of the first conductive layers in a region where the first area and the first dummy block region overlap, wherein
the first conductive layers include, in the first area, a plurality of first terraced portions, each of which does not overlap an upper first conductive layer, and include, in the second area, a plurality of second terraced portions, each of which does not overlap an upper first conductive layer, and
contacts for the first conductive layers are coupled to the second terraced portions, and at least one of the first terraced portions is included in the first dummy block region.

2. The device of claim 1, wherein
a width of the first dummy block region in the second direction is approximately equal to a width of one of the block regions in the second direction, and
the insulating members are provided on both sides of the first dummy block region.

3. The device of claim 2, wherein
the first terraced portions are included between the two insulating members provided on the both sides of the first dummy block region.

4. The device of claim 2, wherein
the substrate further includes a third area, the third area being adjacent to the first dummy block region on an opposite side of the block regions, a width of the third area in the second direction being greater than the width of the first dummy block region in the second direction, and
the insulating members are not included in the third area.

5. The device of claim 2, wherein
the substrate further includes a third area, the third area being adjacent to the first dummy block region on an opposite side of the block regions, a width of the third area in the second direction being greater than the width of the first dummy block region in the second direction, and
the first terraced portions are not included in the third area.

6. The device of claim 2, wherein
the substrate further includes a third area, the third area being adjacent to the first dummy block region on an opposite side of the block regions, a width of the third area in the second direction being greater than the width of the first dummy block region in the second direction, and
a pillar similar to the second pillars is not included in the third area.

7. The device of claim 4, wherein
at least one of the first terraced portions is included in the third area.

8. The device of claim 1, wherein
the substrate further includes a second dummy block region, the second dummy block region being adjacent to the block regions in the second direction on an opposite side of the first dummy block region, and
the first conductive layers include at least one first conductive layer, the first conductive layer including a terraced portion that does not overlap an upper first conductive layer in a region where the first area and the second dummy block region overlap.

9. The device of claim 1, wherein
each of the first pillars includes a semiconductor layer and an insulating layer, the semiconductor layer extending in the third direction, the insulting layer covering a side surface of the semiconductor layer, and an intersecting portion of one of the first pillars and one of the first conductive layers functioning as a memory cell, and
on a cross section including one of the first conductive layers and along the first direction and the second direction, the first pillars and the second pillars include a same layer structure.

10. The device of claim 1, further comprising:
a plurality of third pillars penetrating at least one of the first conductive layers in a region where the second area and the block regions overlap, wherein
on a cross section including one of the first conductive layers and along the first direction and the second direction, the second pillars and the third pillars include a same structure.

11. The device of claim 1, further comprising:
a plurality of second conductive layers arranged in the third direction and spaced apart from each other between the substrate and the first conductive layers, the second conductive layers being partitioned by the insulating members, wherein
the plurality of second conductive layers include, in the first area, a plurality of third terraced portions, each of which does not overlap an upper second conductive layer, and include, in the second area, a plurality of fourth terraced portions, each of which does not overlap an upper second conductive layer, and
in the first area, one of the first terraced portions and one of the third terraced portions overlap.

12. The device of claim 11, further comprising:
a plurality of fourth pillars penetrating the second conductive layers in the region where the first area and the block regions overlap, the fourth pillars respectively being coupled to the first pillars; and
a plurality of fifth pillars penetrating at least one of the second conductive layers in the region where the first area and the first dummy block region overlap, wherein
contacts for the second conductive layers are coupled to the fourth terraced portions, and at least one of the third terraced portions is included in the first dummy block region.

13. The device of claim 1, wherein
each of the first pillars includes a semiconductor layer and an insulating layer, the semiconductor layer extending in the third direction, the insulating layer covering a side surface of the semiconductor layer, and an intersecting portion of at least one of the first pillars and at least one of the first conductive layers functioning as a memory cell,
each of the insulating members includes an insulator and a conductor in the insulator, the insulator expanding in the first direction and the third direction, and the conductor being isolated by the insulator from the first conductive layers in the second direction, and
the conductor is coupled to the semiconductor layer in each of the first pillars through the substrate, and functions as a source line contact.

14. The device of claim 1, wherein
a number of the second pillars included in the first dummy block region and arranged in the second direction is less than a number of the first pillars included in one of the block regions and arranged in the second direction.

15. A semiconductor memory device comprising:
a substrate including a first area and a second area arranged in a first direction;
a plurality of insulating members each extending in the first direction and being arranged in a second direction intersecting the first direction;
a plurality of first conductive layers arranged in a third direction intersecting both the first direction and the second direction and spaced apart from each other, the first conductive layers including a plurality of region portions partitioned by the insulating members, and the region portions being arranged alternately with the insulating members in the second direction;
a plurality of first pillars penetrating the first conductive layers in the first area; and
a plurality of second pillars, wherein
the first conductive layers include a plurality of first terraced portions, each of which does not overlap an upper first conductive layer, at an end portion in the first area in the second direction, and include a plurality of second terraced portions, each of which does not overlap an upper first conductive layer, in the second area,
contacts for the plurality of first conductive layers are coupled to the second terraced portions, and at least one of the first terraced portions is arranged between two insulating members adjacent in the second direction among the insulating members, and
the plurality of second pillars are provided to penetrate at least one of the first conductive layers in the first terraced portions.

16. The device of claim 15, wherein
the first pillars and the second pillars are each arranged in staggered rows, and the second pillars are provided at a greater pitch than the first pillars.

17. The device of claim 15, wherein
on a cross section including one of the first conductive layers and along the first direction and the second direction, a cross-sectional area of the second pillars is greater than a cross-sectional area of the first pillars.

18. The device of claim 15, further comprising:
a plurality of third pillars penetrating at least one of the first conductive layers in the second terraced portions, wherein
on a cross section including one of the first conductive layers and along the first direction and the second direction, the second pillars and the third pillars include a same structure.

19. The device of claim 18, wherein
each of the first pillars has a different layer structure from the second pillars and the third pillars on the cross section and includes a semiconductor layer and an insulating layer, the semiconductor layer extending in the third direction, the insulating layer covering a side surface of the semiconductor layer, and an intersecting portion of one of the first pillars and one of the first conductive layers functioning as a memory cell.

* * * * *